United States Patent
Tsai et al.

(10) Patent No.: US 12,538,533 B2
(45) Date of Patent: Jan. 27, 2026

(54) SEMICONDUCTOR DEVICE STRUCTURE AND METHOD FOR FORMING THE SAME

(71) Applicant: Taiwan Semiconductor Manufacturing Company, Ltd., Hsinchu (TW)

(72) Inventors: Ming-Heng Tsai, Taipei (TW); Chun-Sheng Liang, Changhua County (TW); Ta-Chun Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 412 days.

(21) Appl. No.: 18/164,177

(22) Filed: Feb. 3, 2023

(65) Prior Publication Data
US 2024/0266395 A1 Aug. 8, 2024

(51) Int. Cl.
| | | |
|---|---|---|
| H01L 29/06 | (2006.01) | |
| H01L 21/8234 | (2006.01) | |
| H01L 29/423 | (2006.01) | |
| H01L 29/786 | (2006.01) | |
| H01L 29/788 | (2006.01) | |
| H10D 30/67 | (2025.01) | |
| H10D 30/68 | (2025.01) | |
| H10D 62/10 | (2025.01) | |
| H10D 84/01 | (2025.01) | |
| H10D 84/03 | (2025.01) | |

(52) U.S. Cl.
CPC ....... H10D 62/121 (2025.01); H10D 30/6735 (2025.01); H10D 30/6757 (2025.01); H10D 30/689 (2025.01); H10D 30/6891 (2025.01); H10D 84/0128 (2025.01); H10D 84/038 (2025.01)

(58) Field of Classification Search
CPC ............. H10D 62/121; H10D 30/6757; H10D 30/6735; H10D 30/689; H10D 30/6891; H10D 84/0128; H10D 84/038
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |

(Continued)

*Primary Examiner* — Peniel M Gumedzoe

(74) *Attorney, Agent, or Firm* — Birch, Stewart, Kolasch & Birch, LLP

(57) ABSTRACT

A semiconductor device structure includes first nanostructures formed over a substrate. The structure also includes second nanostructures formed over the substrate. The structure also includes a wall structure formed between the first nanostructures and the second nanostructures. The structure also includes a gate structure formed across the first nanostructures, the second nanostructures, and the wall structure. The wall structure includes a main portion and an extending portion, and the main portion is in direct contact with the first nanostructures and the second nanostructures. The extending portion protrudes from the sidewalls of the second nanostructures.

20 Claims, 52 Drawing Sheets

(56) References Cited

U.S. PATENT DOCUMENTS 9,576,814 B2    2/2017   Wu et al.
9,608,116 B2    3/2017   Ching et al.
11,195,930 B1 *   12/2021   Chen ................. H01L 21/76898

* cited by examiner

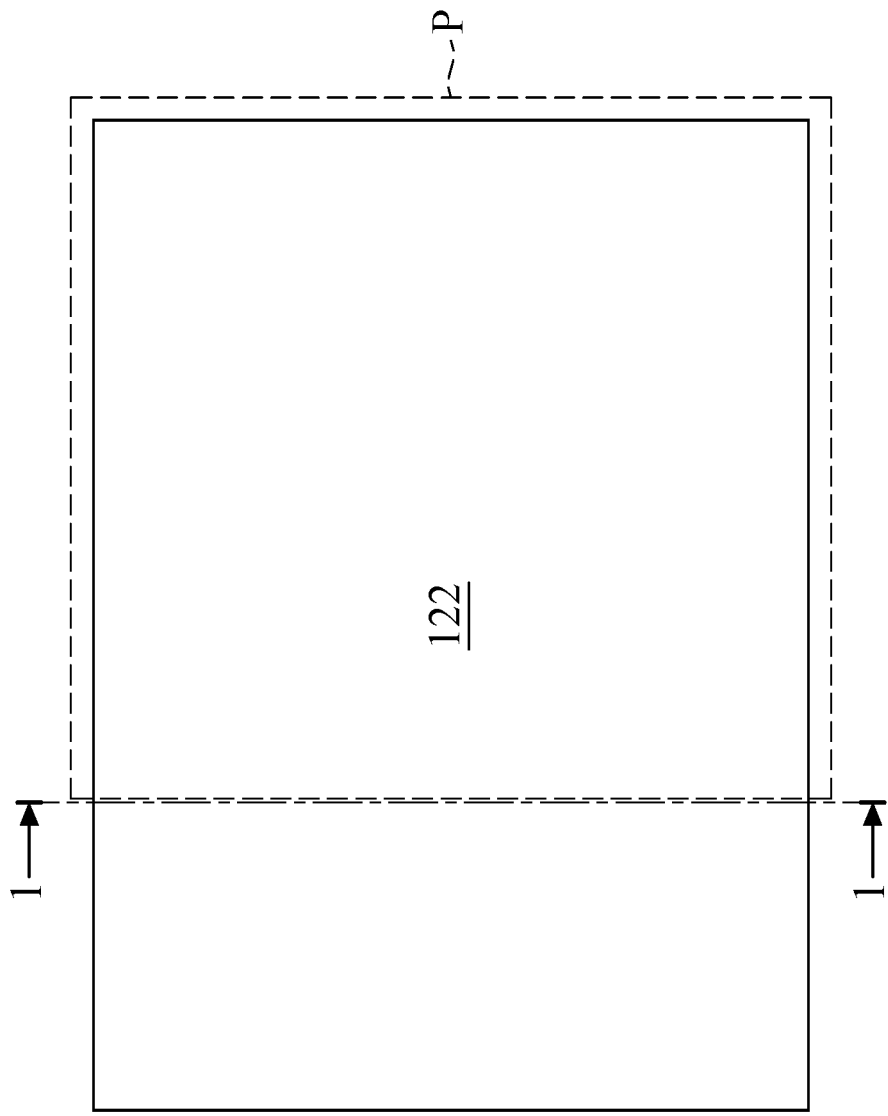

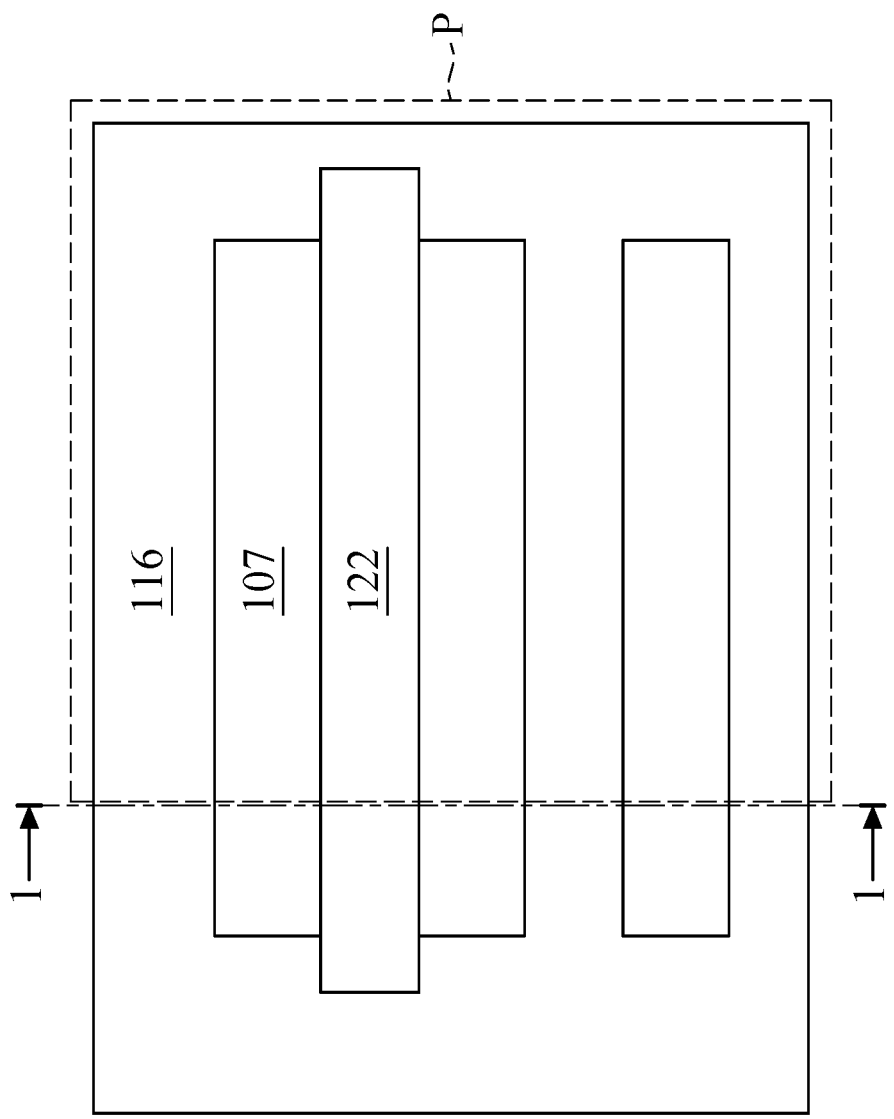

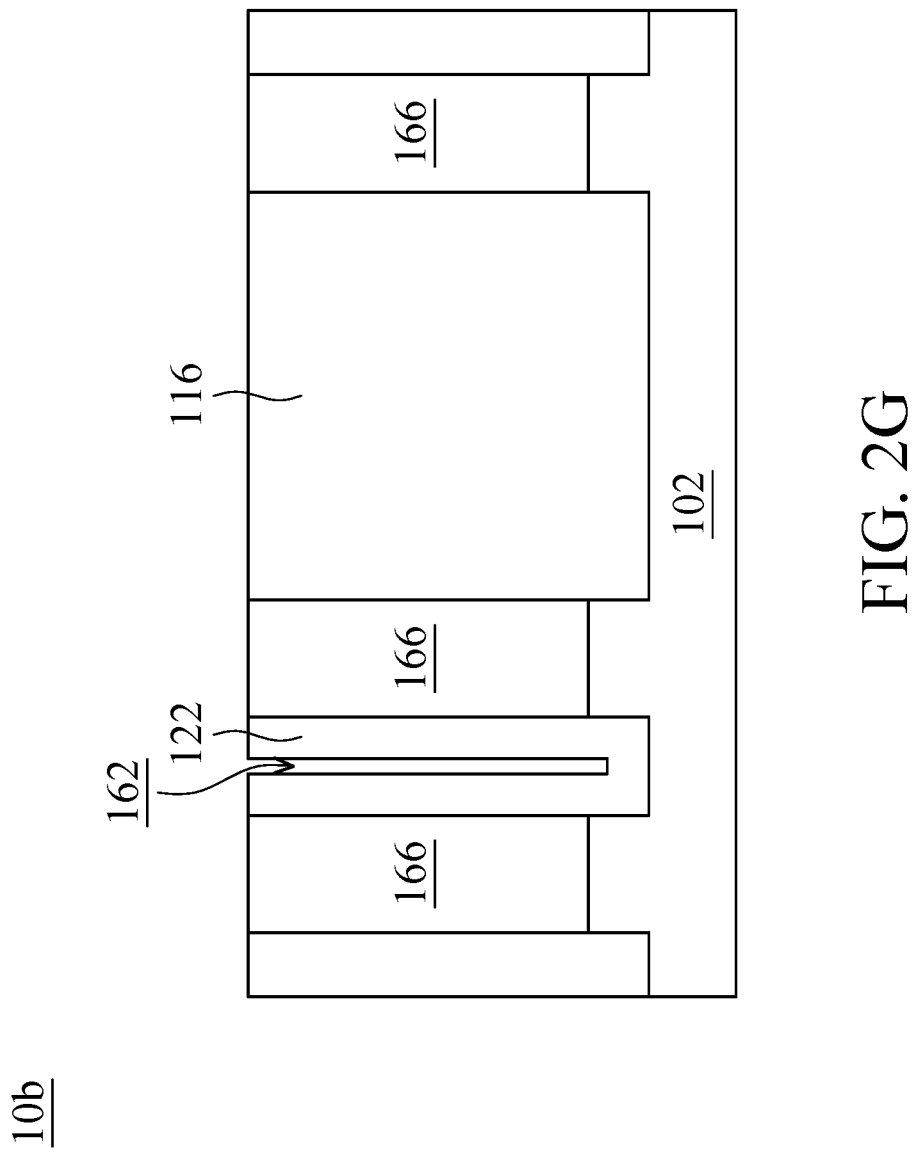

SEMICONDUCTOR DEVICE STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or ILD structures, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure which can extend around the channel region providing access to the channel on two or four sides. GAA devices are compatible with conventional complementary metal-oxide-semiconductor (CMOS) processes.

However, the integration of fabrication of the GAA features around the nanowire can be challenging. While the current methods have been satisfactory in many respects, continued improvements are still needed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1A-1, 1B-1, 1C-1, 1D-1, 1E-1, 1F-1, 1G-1, 1H-1, 1I-1 are cross-sectional representations of various stages of forming a semiconductor device structure, in accordance with some embodiments of the disclosure.

FIGS. 1A-2, 1B-2, 1C-2, 1D-2, 1E-2, 1F-2, 1G-2, 1H-2, 1I-2, 1P-1 are top views of various stages of forming a semiconductor device structure, in accordance with some embodiments of the disclosure.

FIGS. 2A-2G are cross-sectional representations of various stages of forming a semiconductor device structure, in accordance with some embodiments of the disclosure.

FIG. 2G-1 is a top view of a semiconductor device structure, in accordance with some embodiments of the disclosure.

DETAILED DESCRIPTION

Figure 1A:
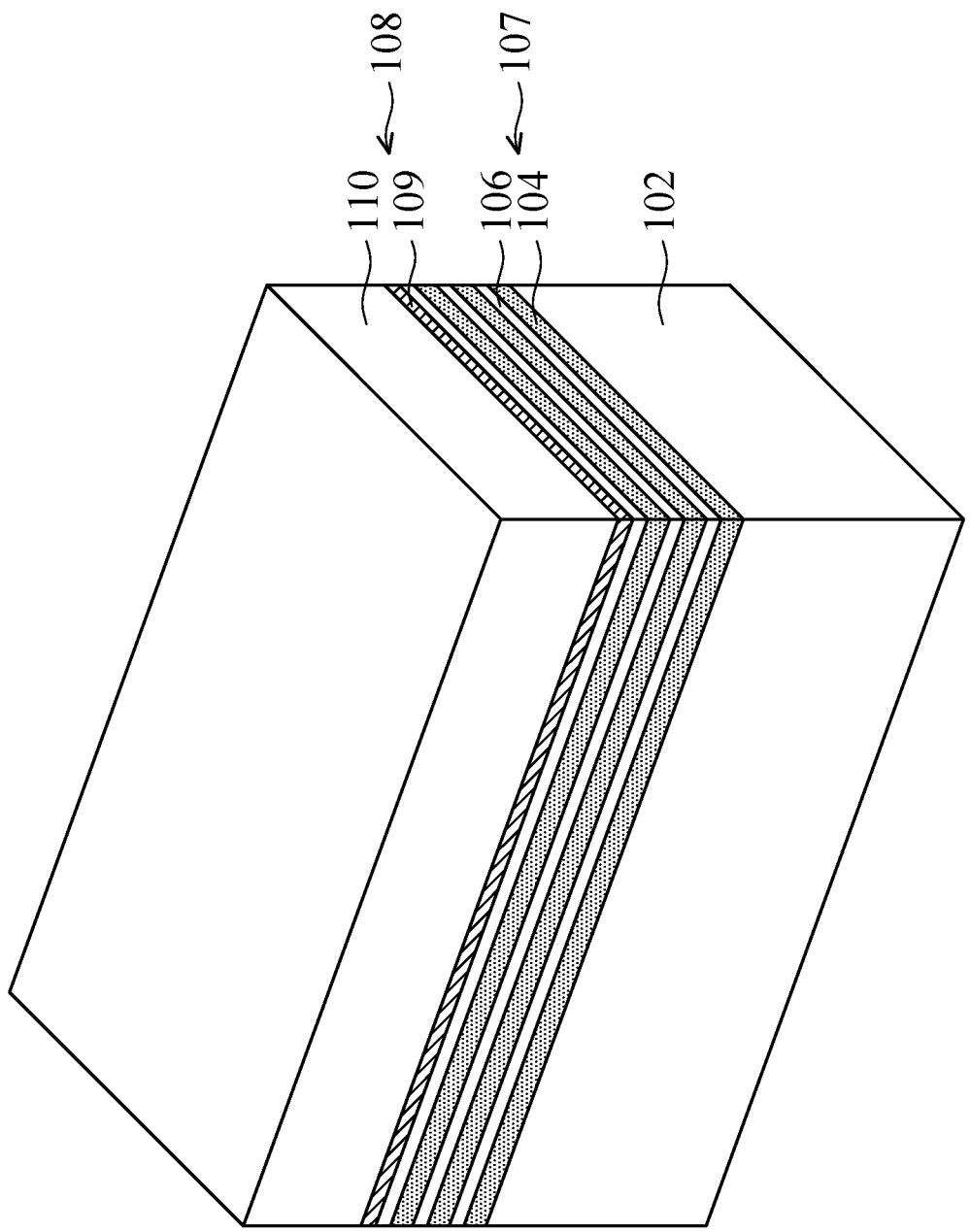
FIGS. 1A, 1B, 1C, 1D, 1E, 1F, 1G, 1H, 1I, 1J-1P are perspective representations of various stages of forming a semiconductor device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The nanostructure transistor (e.g. nanosheet transistor, nanowire transistor, multi-bridge channel, nano-ribbon FET, gate all around (GAA) transistor structures) described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments for forming a semiconductor device structure are provided. The method for forming the semiconductor device structure may include forming a wall structure extending out of the sidewalls of the nanostructures. The wall structure may not be shrunk near the edge of the nanostructures. In addition, the wall structure may also help to stabilize floating gate structures formed over the isolation structure.

The semiconductor device structure 10a may be a gate all around (GAA) transistor structure. FIGS. 1A, 1B, 1C, 1D, 1E, 1F, 1G, 1H, 1I, 1J-1P are perspective representations of various stages of forming a semiconductor device structure 10a, in accordance with some embodiments of the disclosure. FIGS. 1A-1, 1B-1, 1C-1, 1D-1, 1E-1, 1F-1, 1G-1, 1H-1, 1I-1 are cross-sectional representations of various stages of forming a semiconductor device structure 10a, in accordance with some embodiments of the disclosure. FIGS. 1A-2, 1B-2, 1C-2, 1D-2, 1E-2, 1F-2, 1G-2, 1H-2, 1I-2, 1P-1 are top views of various stages of forming a semiconductor device structure 10a, in accordance with some embodiments of the disclosure. FIGS. 1A-1, 1B-1, 1C-1, 1D-1, 1E-1, 1F-1, 1G-1, 1H-1, 1I-1 show cross-sectional representations taken along line 1-1 in FIGS. 1A-2, 1B-2, 1C-2, 1D-2, 1E-2, 1F-2, 1G-2, 1H-2, 1I-2, respectively. FIGS. 1A, 1B, 1C, 1D, 1E, 1F, 1G, 1H, 1I, 1P are perspective representations of the dashed box P shown in FIGS. 1A-2, 1B-2, 1C-2, 1D-2, 1E-2, 1F-2, 1G-2, 1H-2, 1I-2, 1P-1 respectively.

Figures 1, 1A:
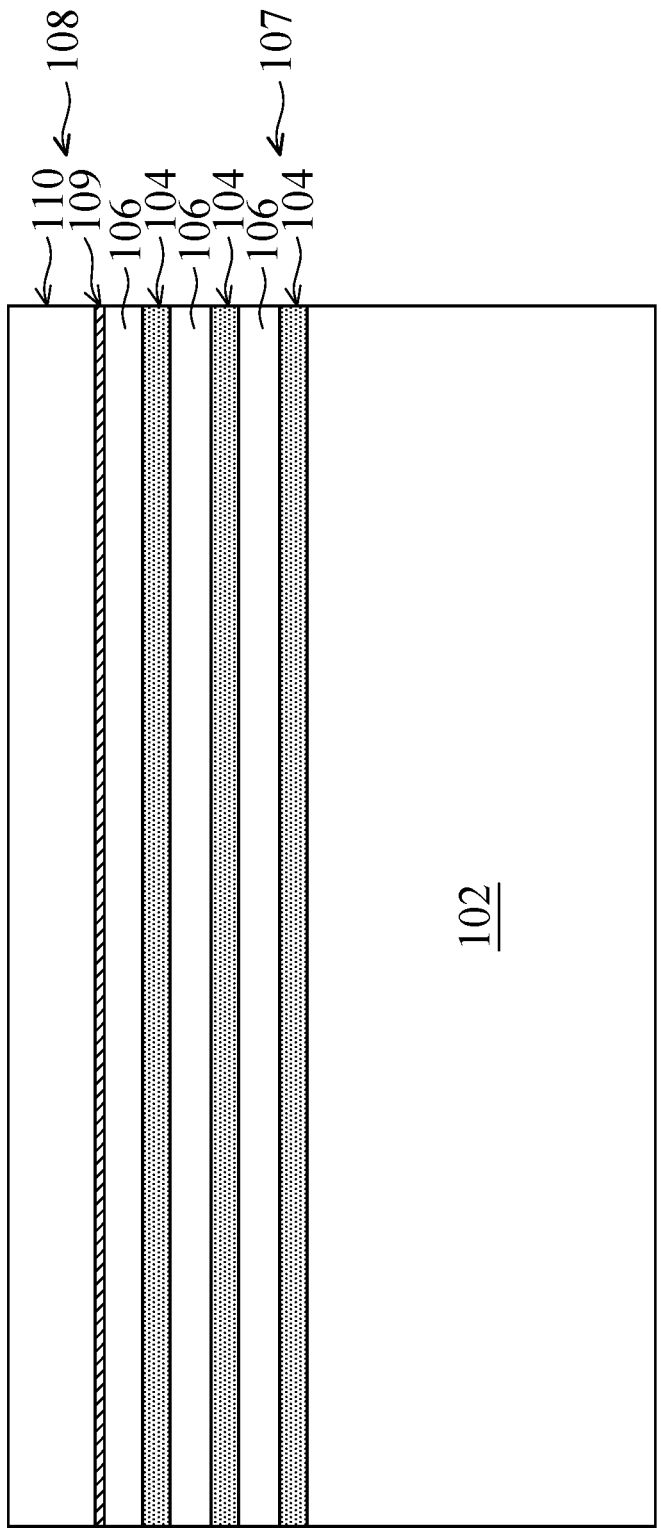

A semiconductor stack including first semiconductor material layers 104 and second semiconductor material layers 106 are formed over a substrate 102, as shown in FIGS. 1A and 1A-1 in accordance with some embodiments. The substrate 102 may be a semiconductor wafer such as a silicon wafer. The substrate 102 may also include other elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium nitride, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP. The substrate 102 may include an epitaxial layer. For example, the substrate 102 may be an epitaxial layer overlying a bulk semiconductor. In addition, the substrate 102 may also be semiconductor on insulator (SOI). The SOI substrate may be fabricated by a wafer bonding process, a silicon film transfer process, a separation by implantation of oxygen (SIMOX) process, other applicable methods, or a combination thereof. The substrate 102 may be an N-type substrate. The substrate 102 may be a P-type substrate.

Next, first semiconductor material layers 104 and second semiconductor material layers 106 are alternating stacked over the substrate 102 to form the semiconductor stack 107, as shown in FIGS. 1A and 1A-1 in accordance with some embodiments. The first semiconductor material layers 104 and the second semiconductor material layers 106 may include Si, Ge, SiGe, GaAs, InSb, GaP, GaSb, InAlAs, InGaAs, GaSbP, GaAsSb, or InP. The first semiconductor material layers 104 and second semiconductor material layers 106 may be made of different materials with different etching rates. In some embodiments, the first semiconductor material layers 104 are made of SiGe and the second semiconductor material layers 106 are made of Si.

The first semiconductor material layers 104 and second semiconductor material layers 106 may be formed by low pressure chemical vapor deposition (LPCVD) process, epitaxial growth process, other applicable methods, or a combination thereof. The epitaxial growth process may include molecular beam epitaxy (MBE), metal organic chemical vapor deposition (MOCVD), or vapor phase epitaxy (VPE).

It should be noted that, although there are three layers of the first semiconductor material layers 104 and three layers of the second semiconductor material layers 106 shown in FIGS. 1A and 1A-1, the number of the first semiconductor material layers 104 and second semiconductor material layers 106 are not limited herein, depending on the demand of performance and process. For example, the semiconductor structure may include two to five layers of the first semiconductor material layers 104 and two to five layers of the second semiconductor material layers 106.

Next, a mask structure 108 is formed over the semiconductor stack 107, as shown in FIGS. 1A and 1A-1 in accordance with some embodiments. The mask structure 108 may be a multilayer structure including a pad layer 109 and a hard mask layer 110 formed over the pad layer 109. The pad layer 109 may be made of silicon oxide, which may be formed by thermal oxidation or CVD. The hard mask layer 110 may be made of silicon nitride, which may be formed by CVD, such as LPCVD or plasma-enhanced CVD (PECVD).

Figures 1, 1A, 2:
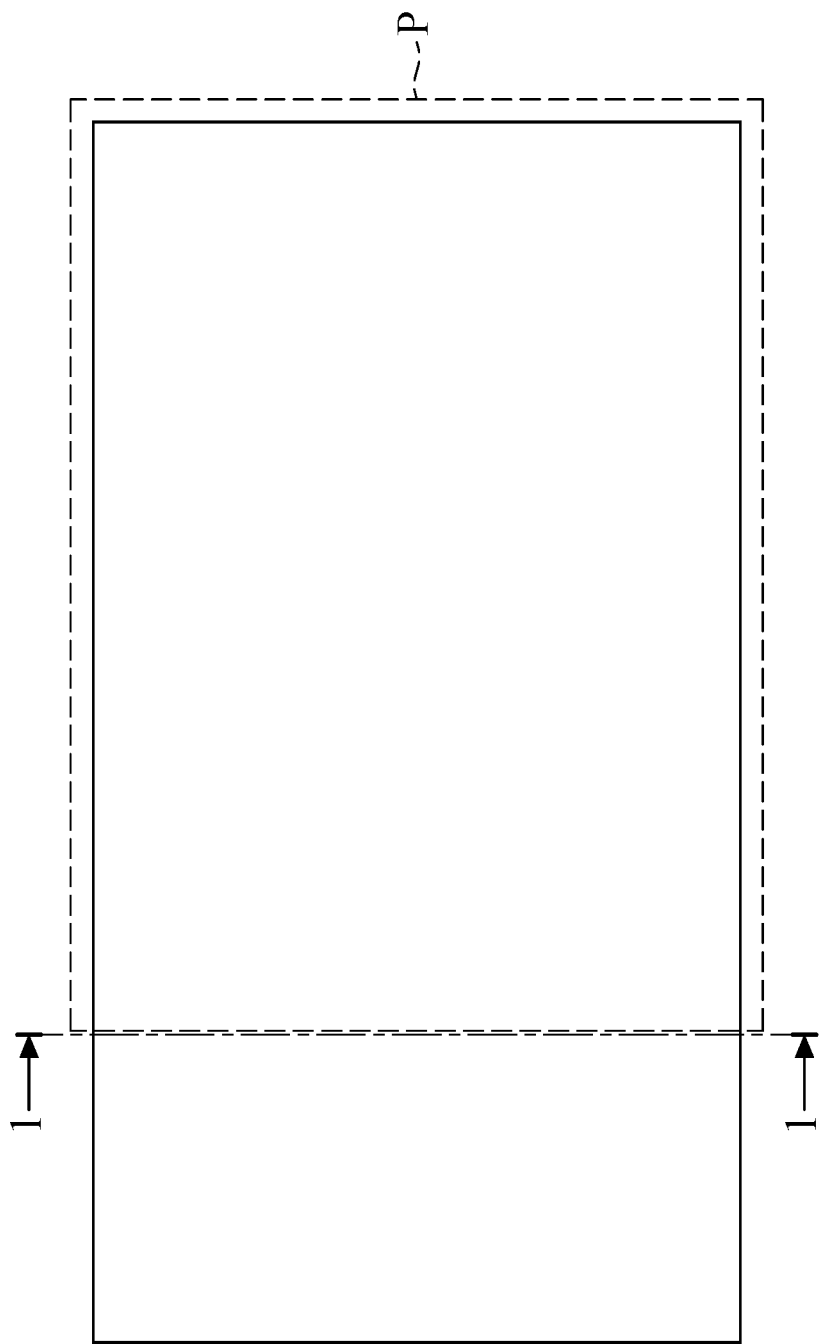
Figure 1B:
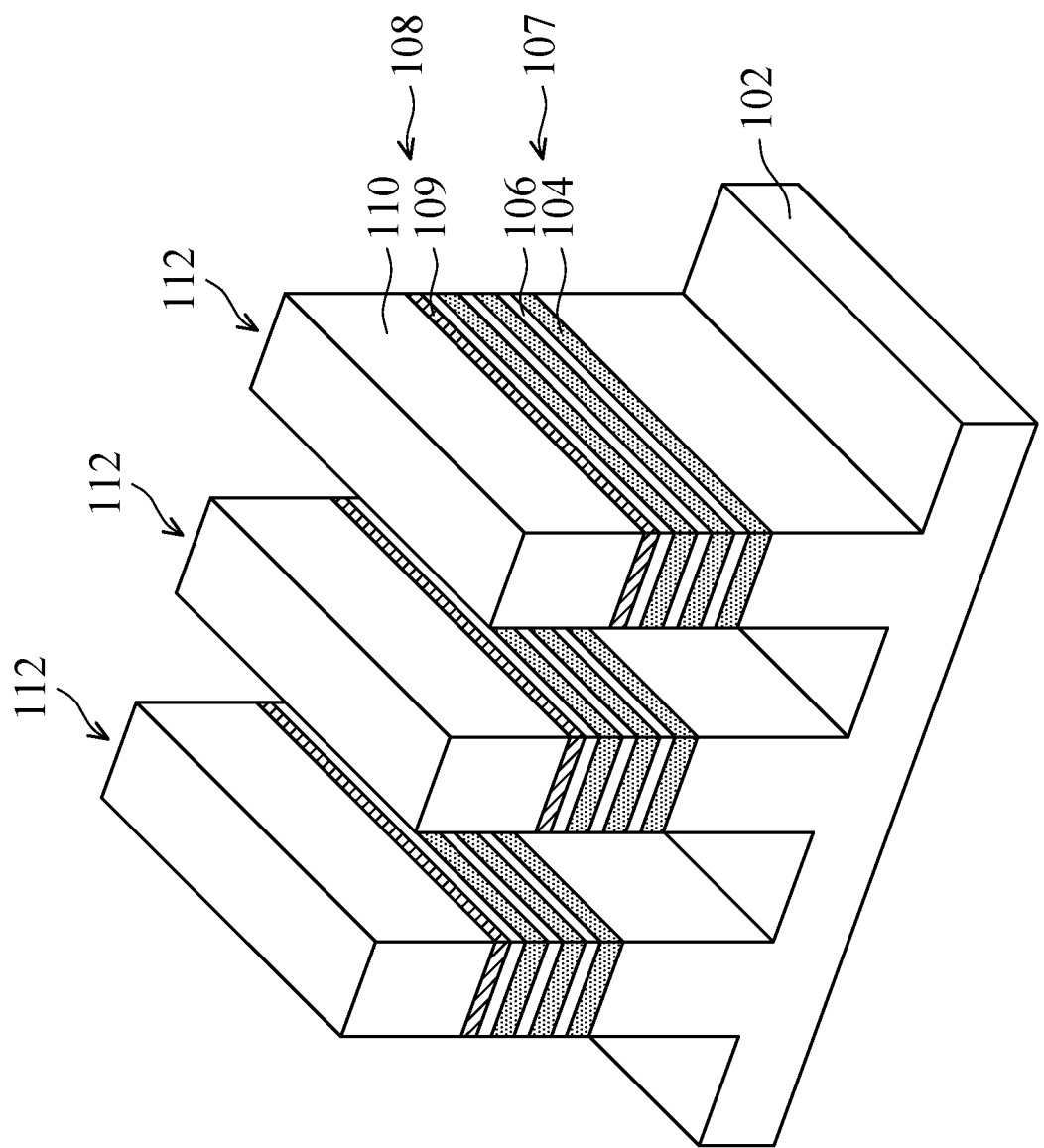
Figures 1, 1B:
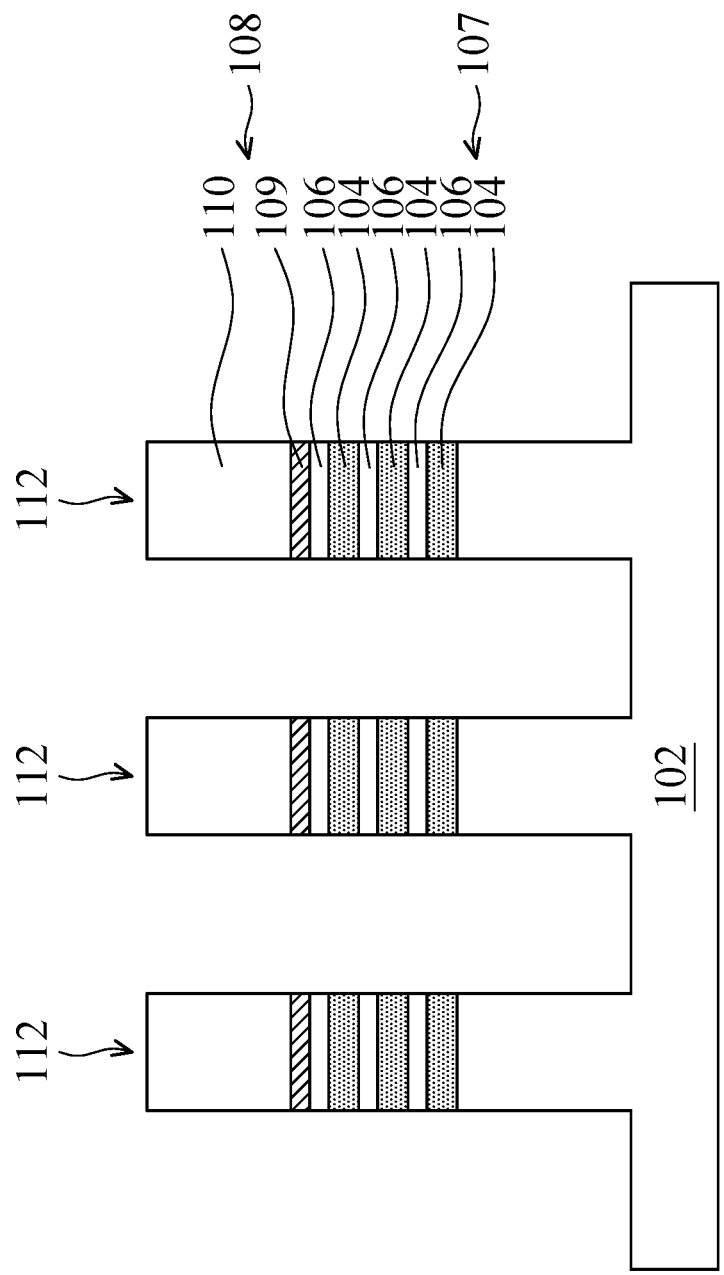
Figures 1, 1B, 2:
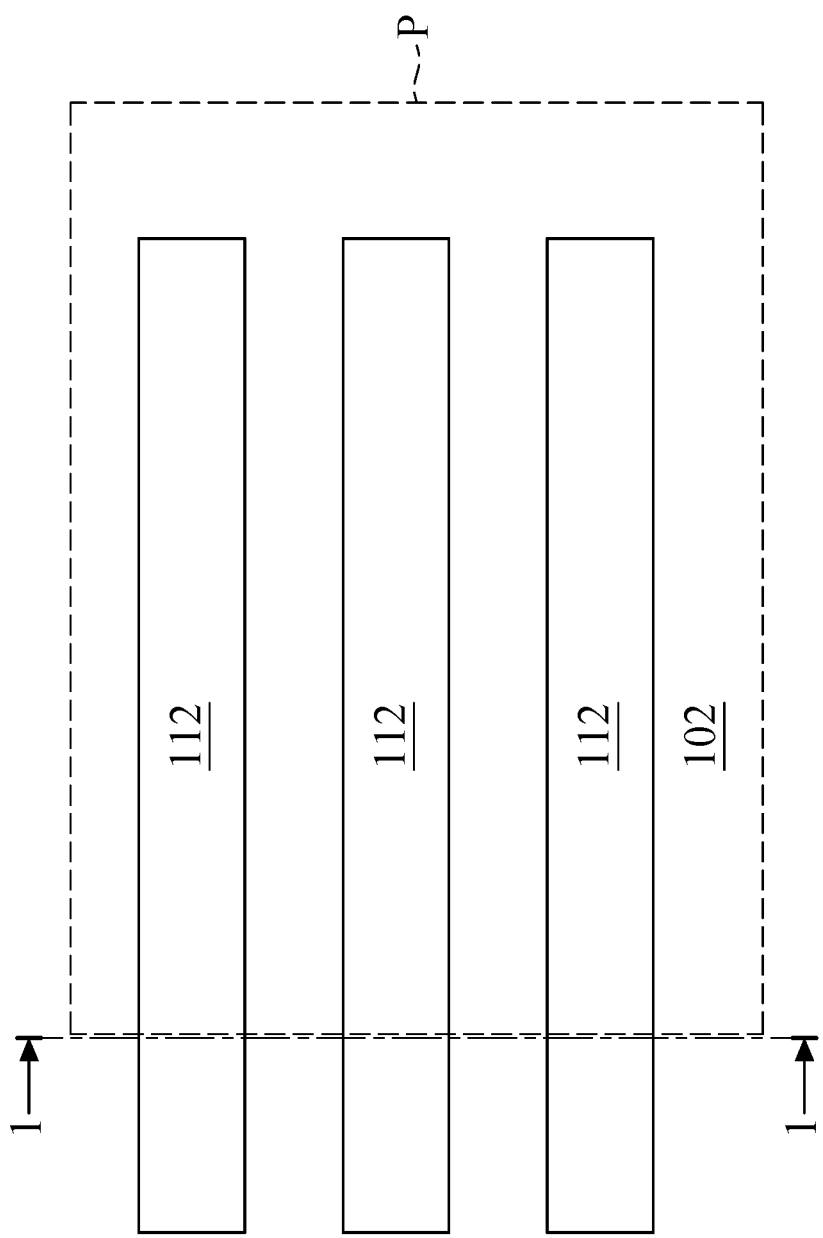

After the first semiconductor material layers 104 and the second semiconductor material layers 106 are formed as the semiconductor stack 107 over the substrate 102, the semiconductor stack 107 is patterned to form fin structures 112 using the mask structure 108 as a mask layer, as shown in FIGS. 1B and 1B-1 in accordance with some embodiments. The fin structures 112 may include base fin structures and the semiconductor stacks 107, including the first semiconductor material layers 104 and the second semiconductor material layers 106, formed over the base fin structure.

The patterning process may including forming a mask structure 108 over the first semiconductor material layers 104 and the second semiconductor material layers 106 and etching the semiconductor stack 107 and the underlying substrate 102 through the mask structure 108, as shown in FIGS. 1B and 1B-1 in accordance with some embodiments.

The patterning process of forming the fin structures 112 may include a photolithography process and an etching process. The photolithography process may include photoresist coating (e.g., spin-on coating), soft baking, mask aligning, exposure, post-exposure baking, developing the photoresist, rinsing and drying (e.g., hard baking). The etching process may include a dry etching process or a wet etching process.

Figure 1C:
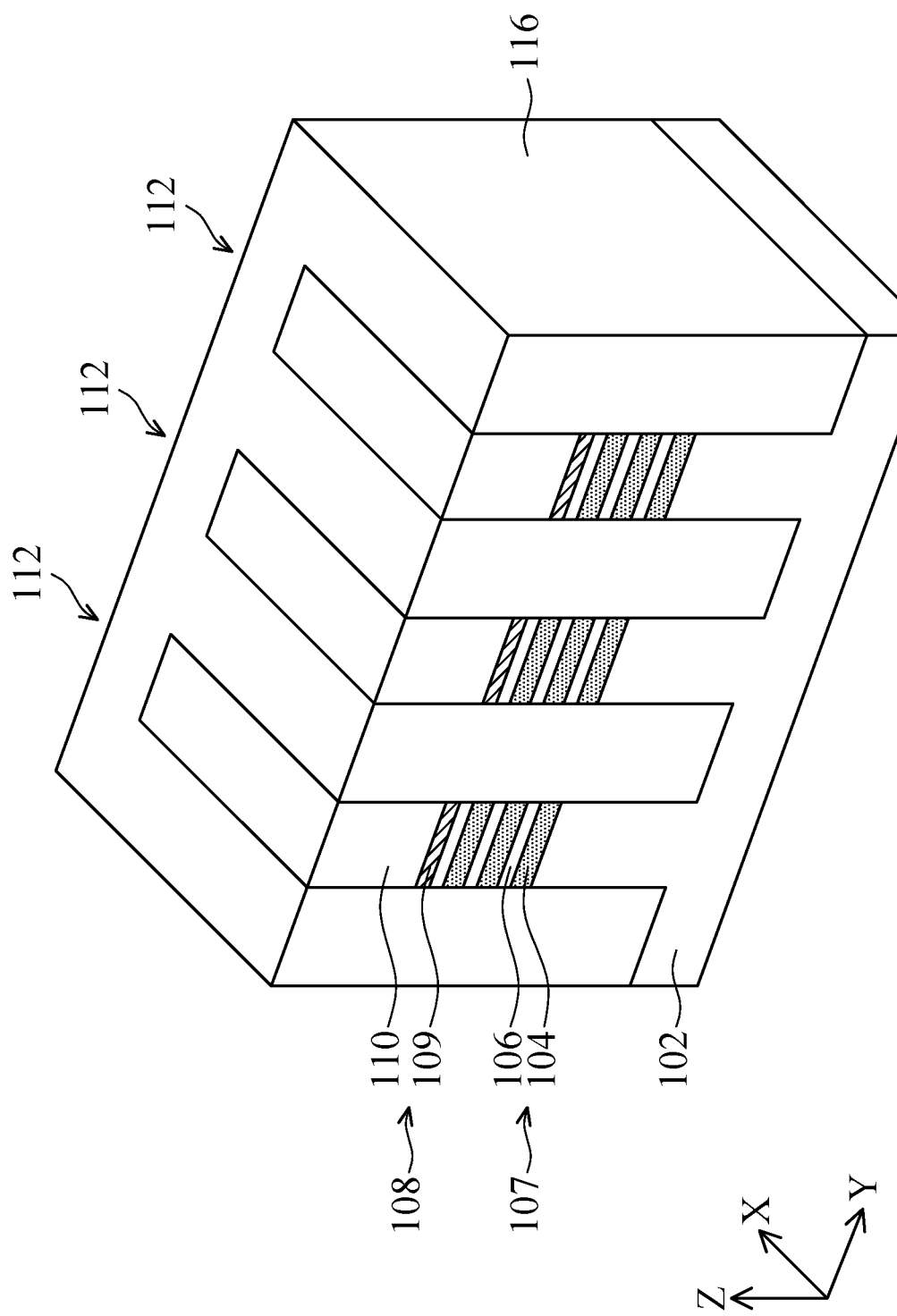
Figures 1, 1C:
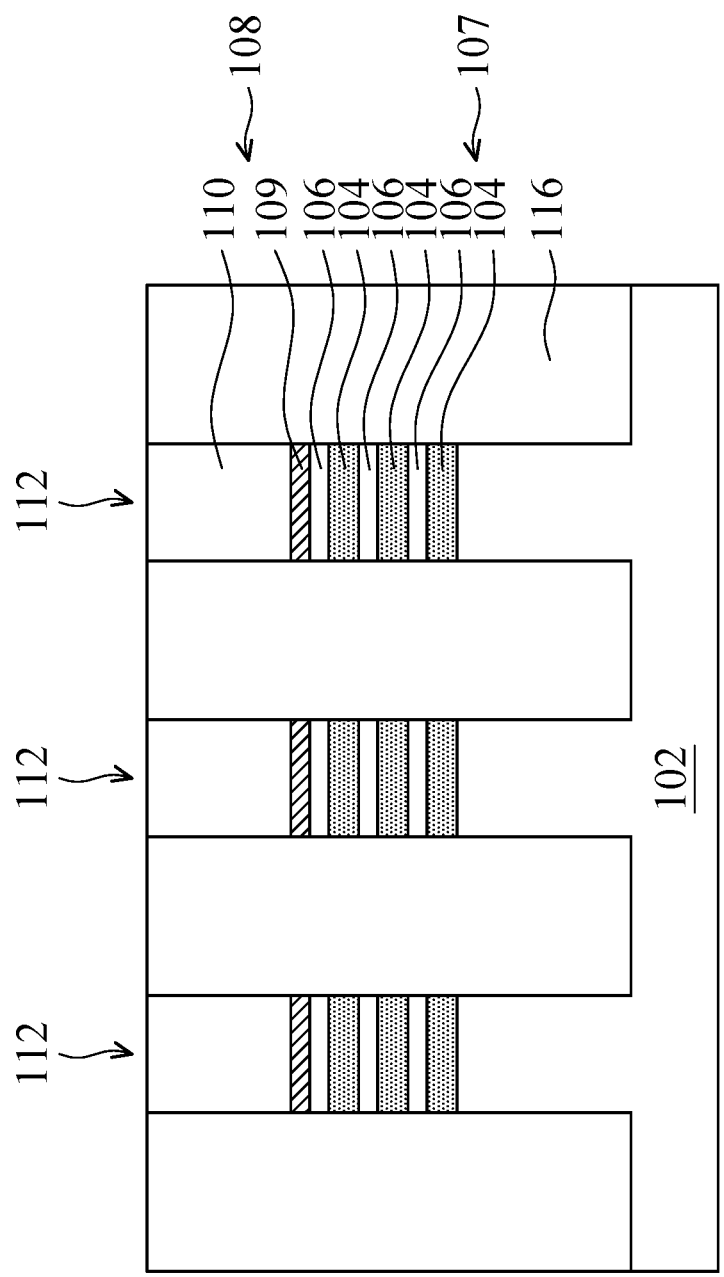
Figures 1, 1C, 2:
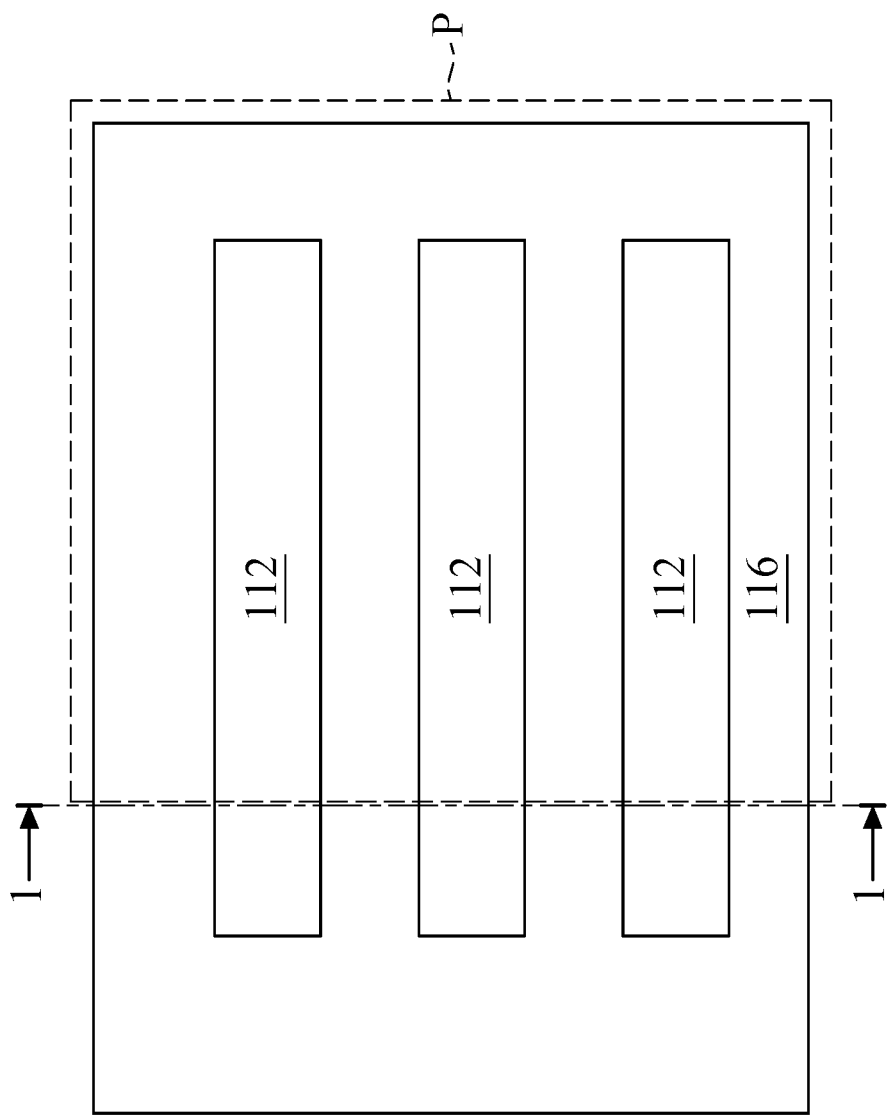

Next, the end portions of the fin structures 112 are removed, as shown in FIGS. 1C and 1C-1 in accordance with some embodiments. The substrate 102 may be exposed at the end portions of the fin structures 112. The end portions of the fin structures 112 may be removed by a photolithography process and an etching process.

After the fin structures 112 are formed, a liner layer may be formed over the fin structures 112 and in the trenches between the fin structures 112. The liner layer may be conformally formed over the substrate 102, the fin structures 112, and the mask structure 108 covering the fin structures 112. The liner layer may be used to protect the fin structures 112 from being damaged in the following processes (such as an anneal process or an etching process). The liner layer may be made of silicon nitride. The liner layer may be formed by using a thermal oxidation, a CVD process, an atomic layer deposition (ALD) process, a LPCVD process, a plasma enhanced CVD (PECVD) process, a HDPCVD process, a flowable CVD (FCVD) process, another applicable process, or a combination thereof.

Next, an isolation material 116 is then filled into the trenches between the fin structures 112 and over the liner layer, as shown in FIGS. 1C, 1C-1 and 1C-2 in accordance with some embodiments. The isolation material 116 may be made of silicon oxide, silicon nitride, silicon oxynitride (SiON), fluoride-doped silicate glass (FSG), other low-k dielectric materials, or a combination thereof. The isolation material 116 may be deposited by a deposition process, such as a chemical vapor deposition (CVD) process (e.g. a flowable CVD (FCVD) process), a spin-on-glass process, or another applicable process.

Figure 1D:
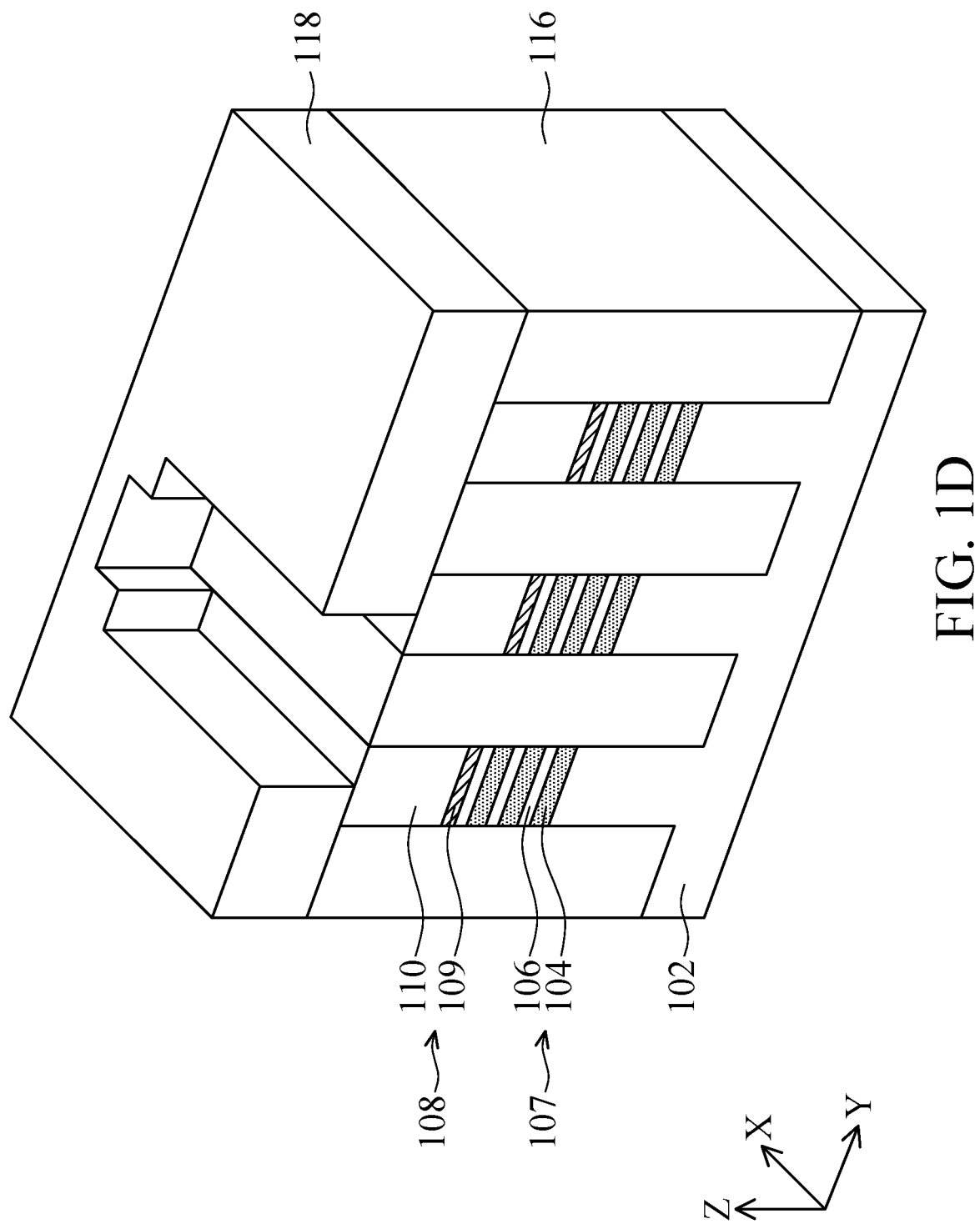
Figures 1, 1D:
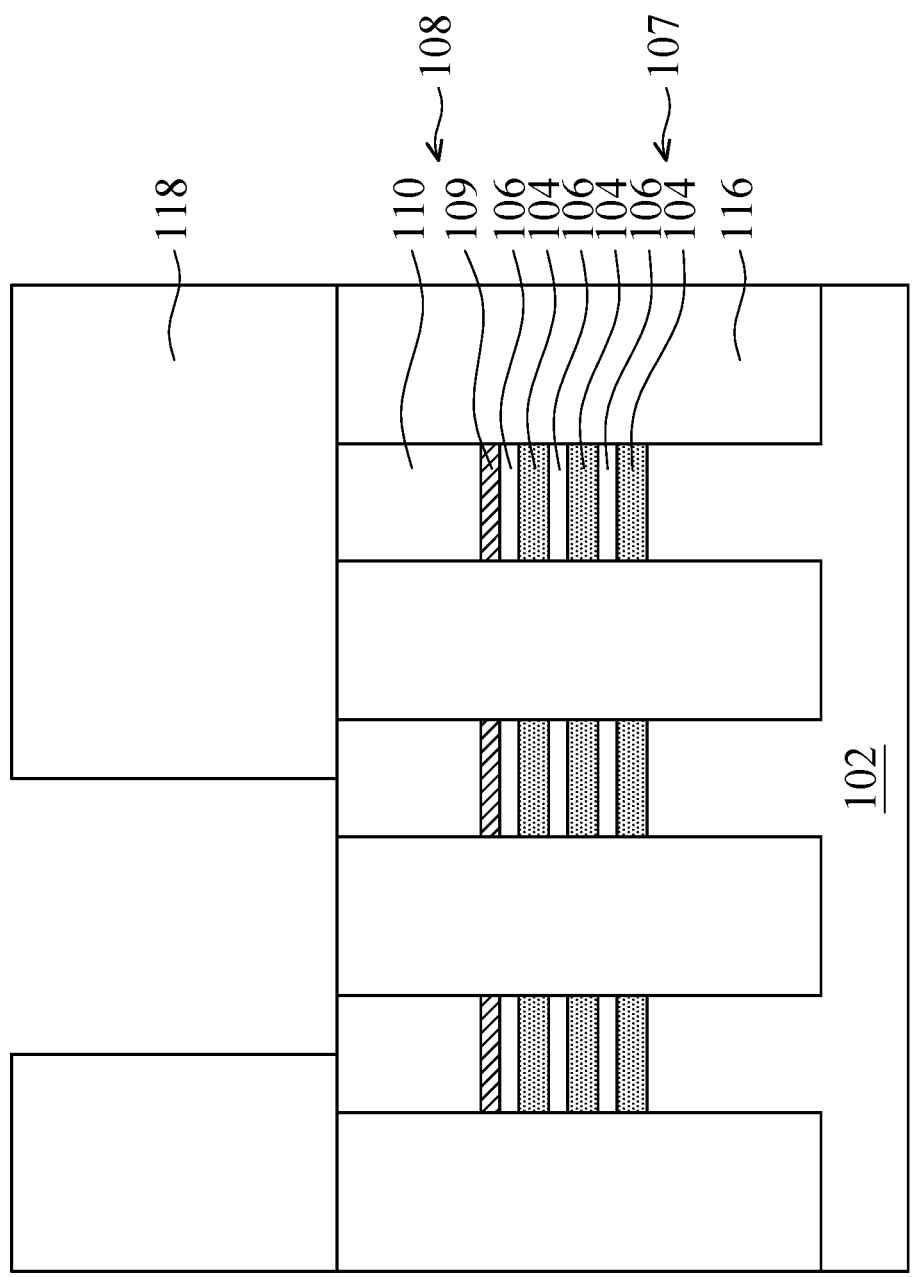
Figures 1, 1D, 2:
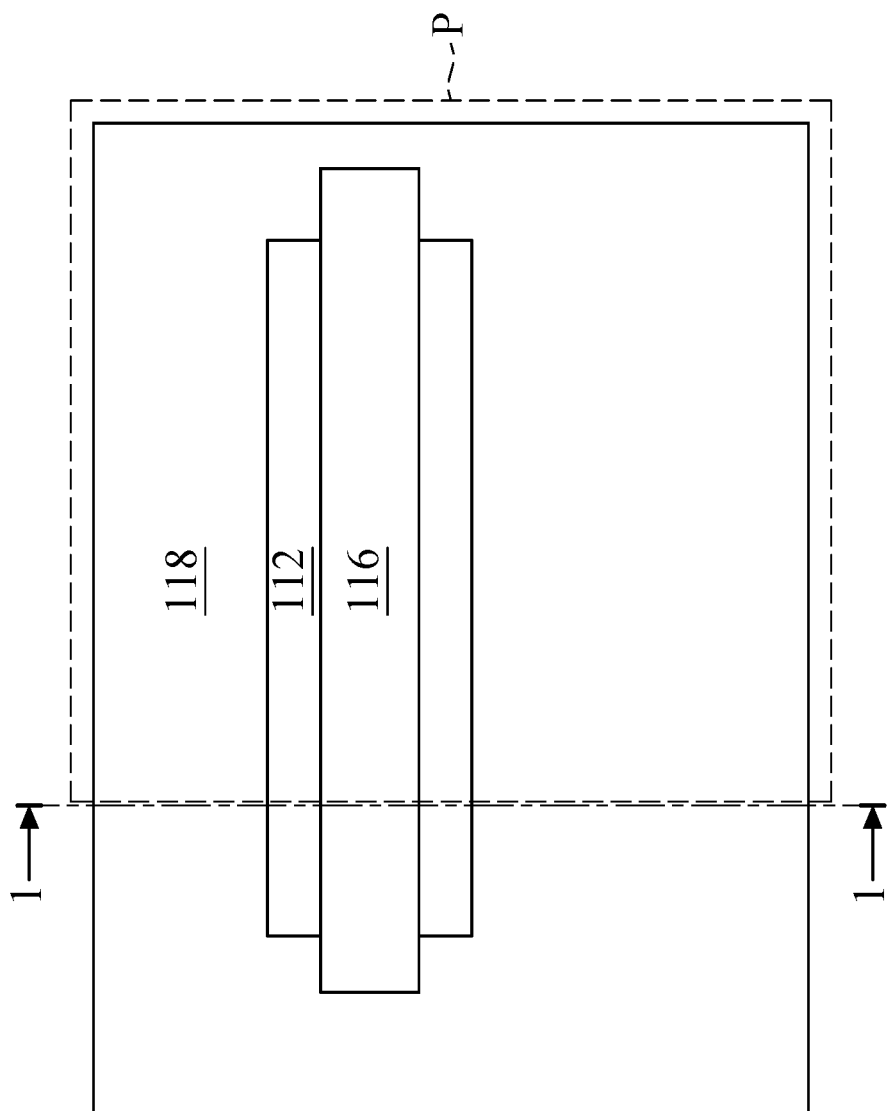

Next, a patterned photoresist layer 118 is formed over the fin structures 112 and the isolation material 116, as shown in FIGS. 1D, 1D-1 and 1D-2 in accordance with some embodiments. A portion of the fin structure 112 and the isolation material 116 between the fin structures 112 may be exposed. In addition, a portion of the isolation material 116 surrounding the end portion of the fin structures 112 may also be exposed.

In some embodiments, the shape of the opening formed in the patterned photoresist layer 118 is merely an example, and is not limited therein. The opening may have an evenly width as the distance between fin structures 112. The opening may have an evenly width greater than the distance between fin structures 112.

Figure 1E:
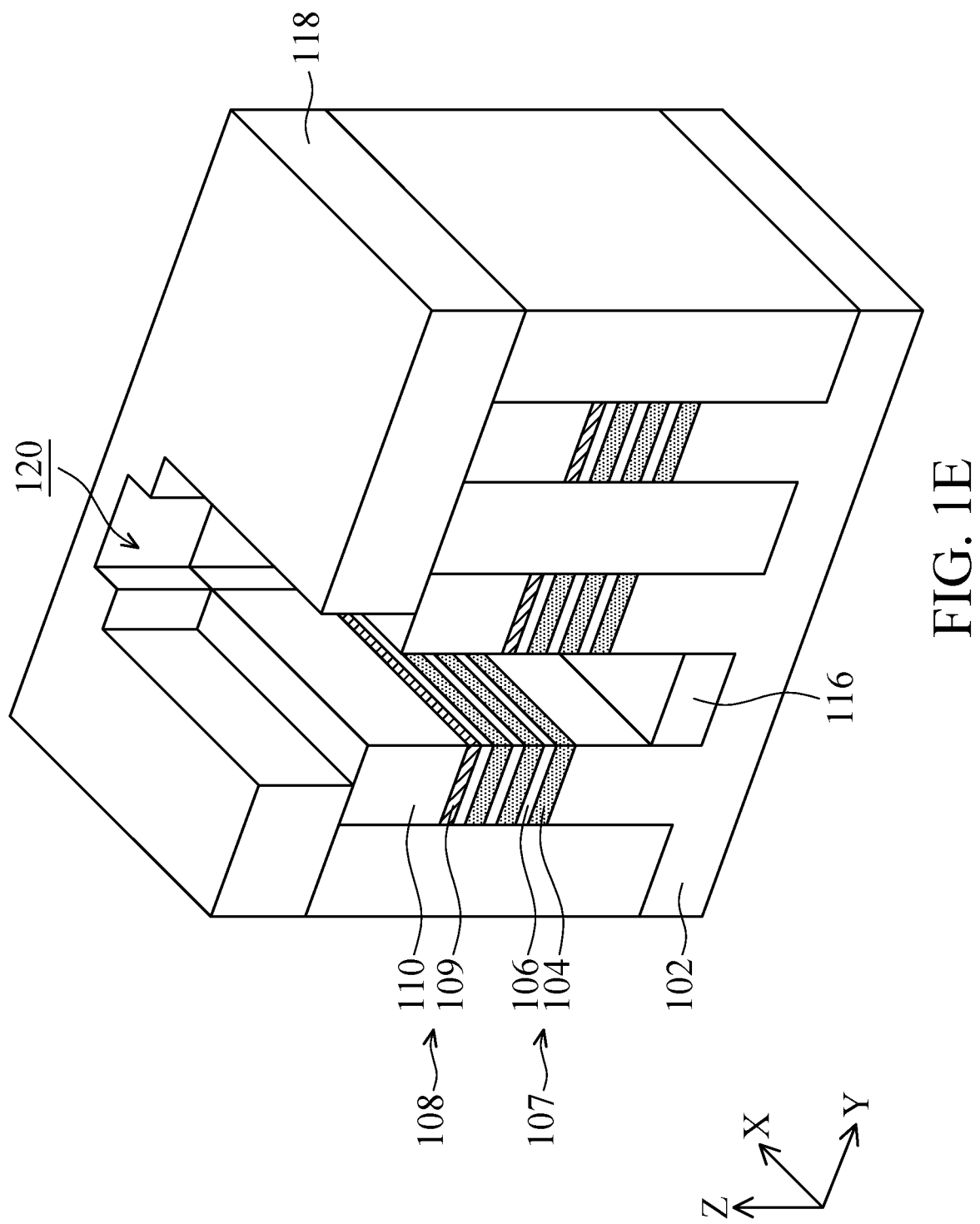
Figures 1, 1E:
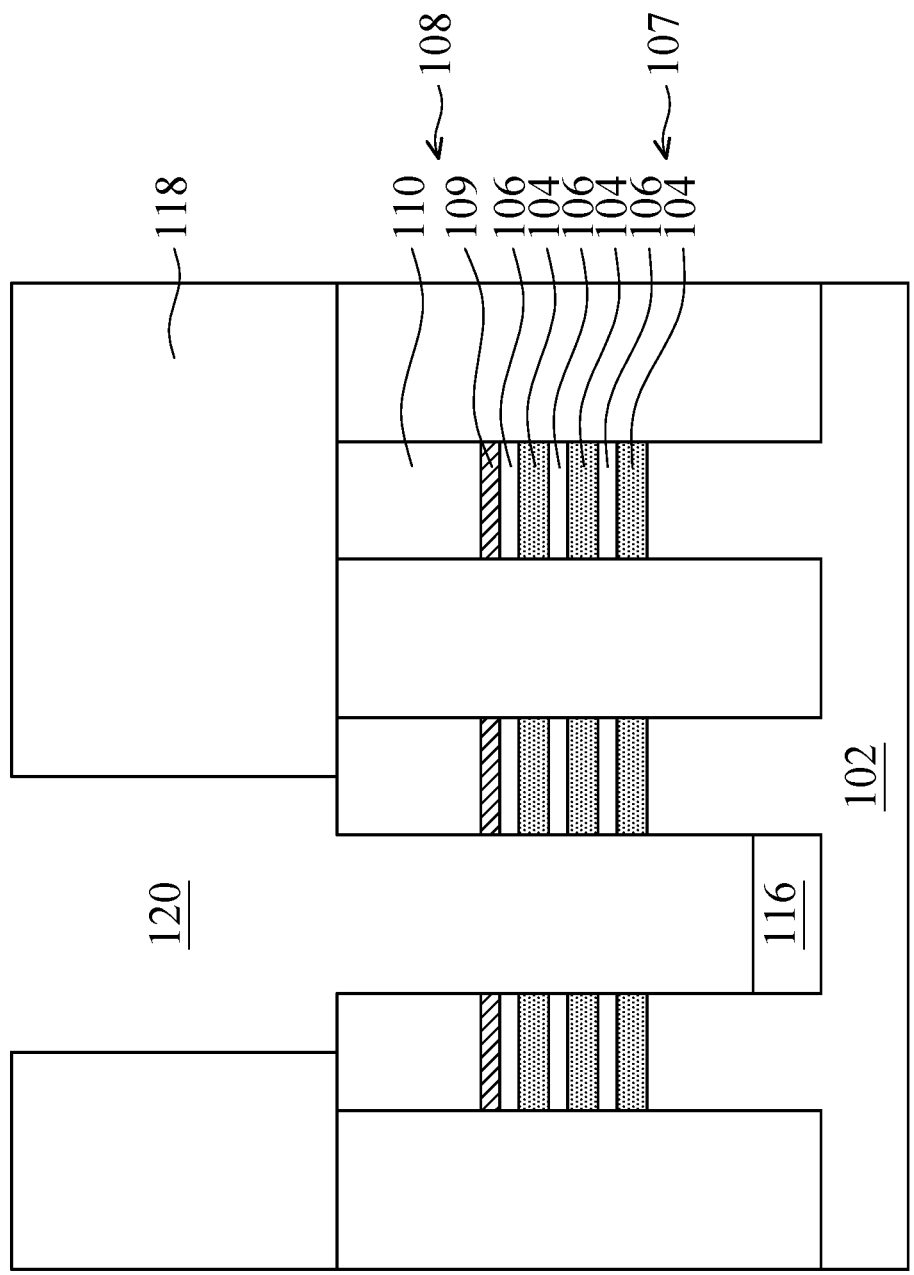
Figures 1, 1E, 2:
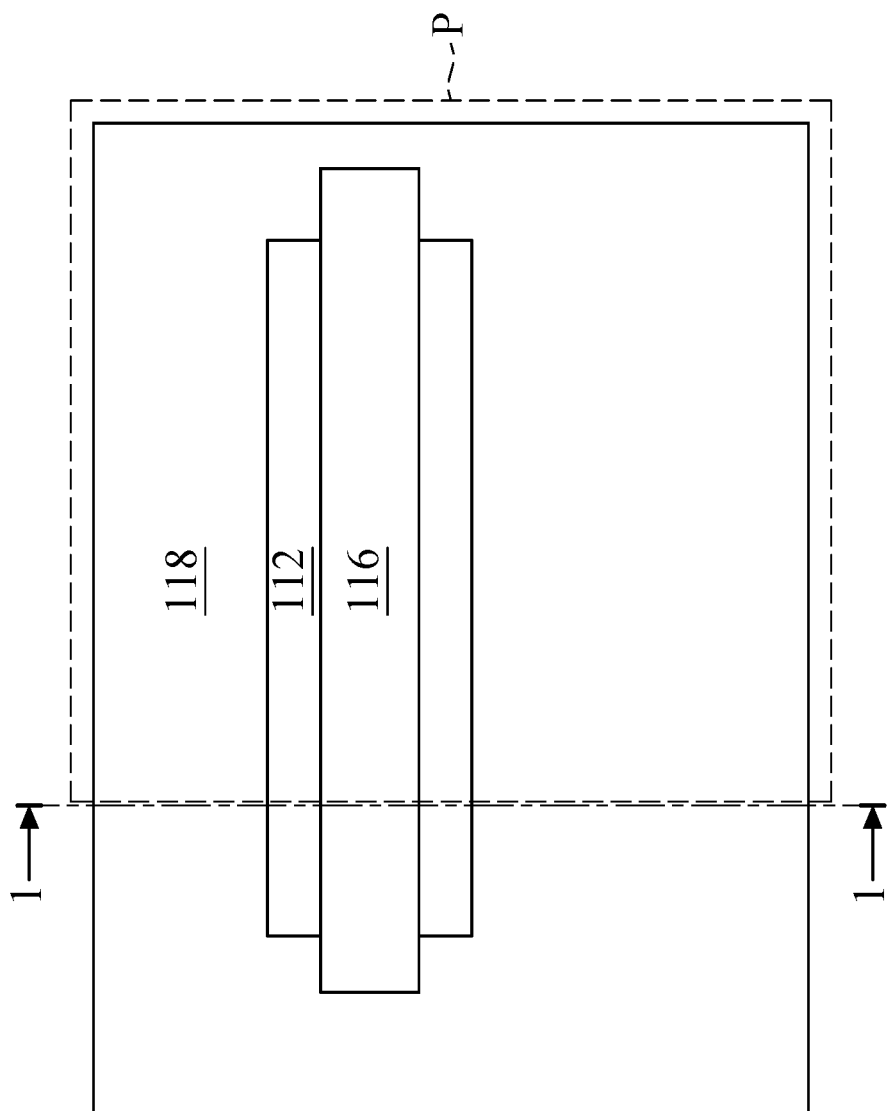

Next, the isolation material 116 exposed by the patterned photoresist layer 118 is etched back, and an opening 120 is formed, as shown in FIGS. 1E, 1E-1 and 1E-2 in accordance with some embodiments. The isolation material 116 may remain at the bottom of the opening 120. In some embodiments, the top surface of the exposed isolation material 116 is lower than the bottom surface of the semiconductor stack 107.

Figure 1F:
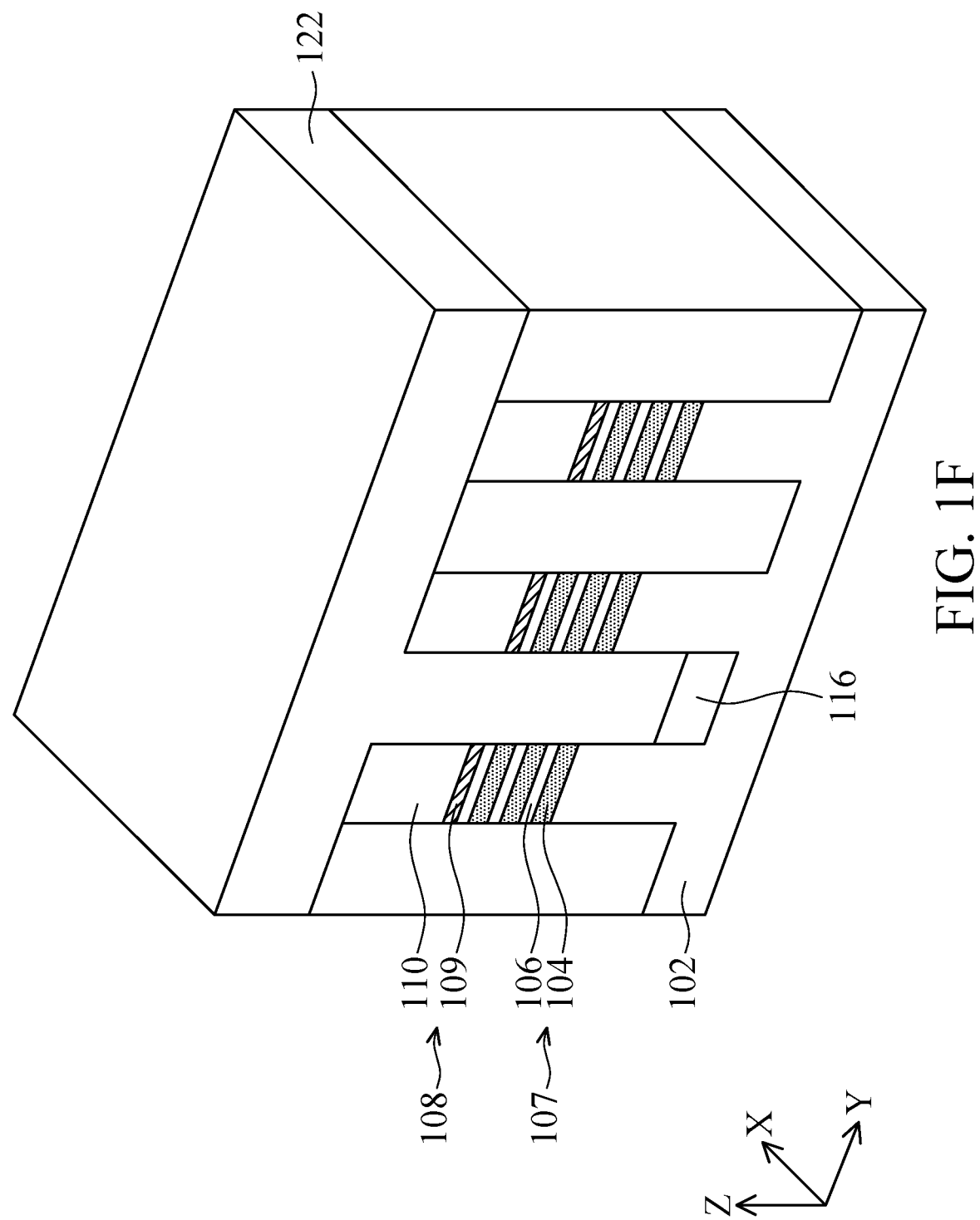
Figures 1, 1F:
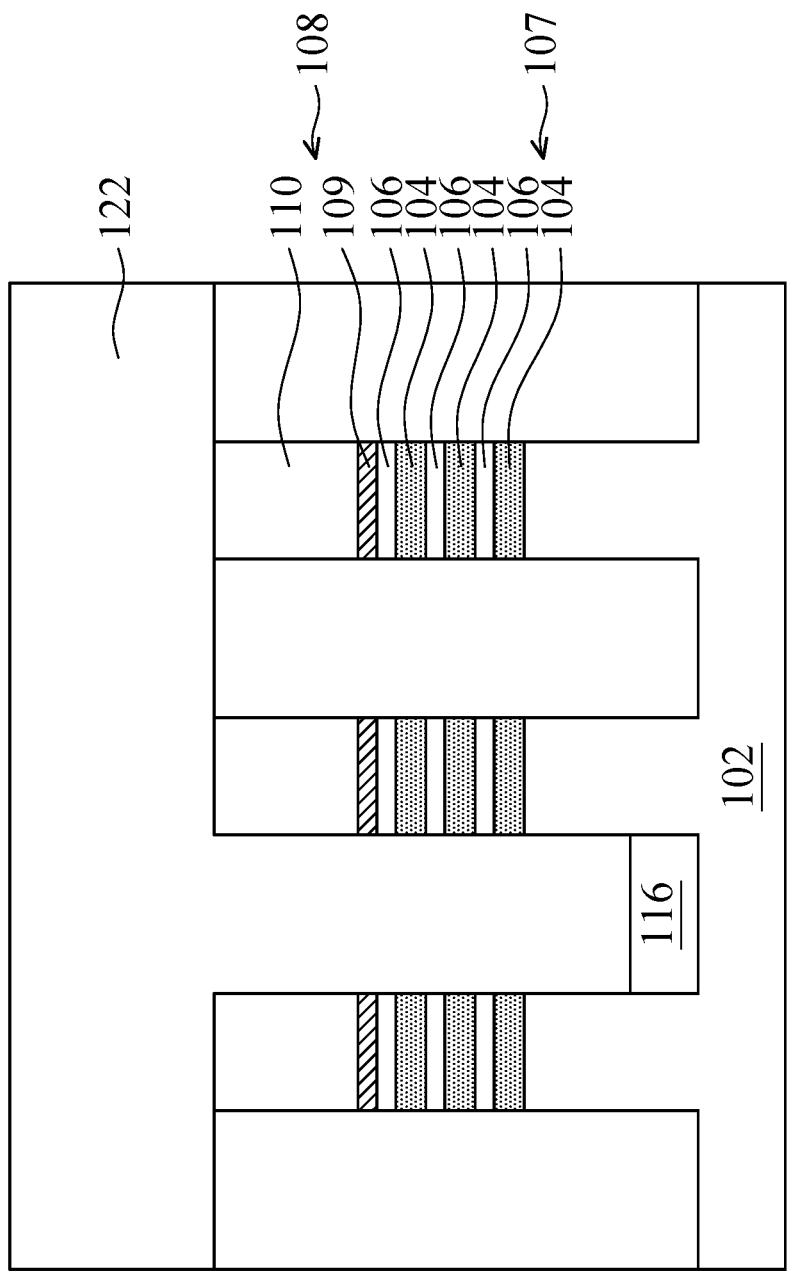

Next, the patterned photoresist layer 118 is removed, and a wall structure material 122 may be formed in the opening 120 and over the fin structures 112 and the isolation material 116, as shown in FIGS. 1F, 1F-1 and 1F-2 in accordance with some embodiments. The wall structure material 122 may include SiN, SiCN, SiOC, SiOCN, other suitable materials, or a combination thereof. The wall structure material 122 may be formed using CVD, ALD, other applicable methods, or a combination thereof.

The wall structure material 122 may be a multi-layer structure, including a liner layer, an etch stop layer formed over the liner layer, and a core dielectric layer formed over the etch stop layer. The liner layer may include SiN, SiCN, SiOC, SiOCN other suitable materials, or a combination thereof. The liner layer may be formed using CVD, ALD, other applicable methods, or a combination thereof. The etch stop layer may include silicon oxide. The liner layer may be formed using high-density plasma CVD (HDP-CVD), flowable CVD (FCVD), other applicable methods, or a combination thereof. The core dielectric layer may include SiN, SiCN, SiOC, SiOCN other suitable materials, or a combination thereof. The core dielectric layer may be formed using CVD, ALD, other applicable methods, or a combination thereof.

Figure 1G:
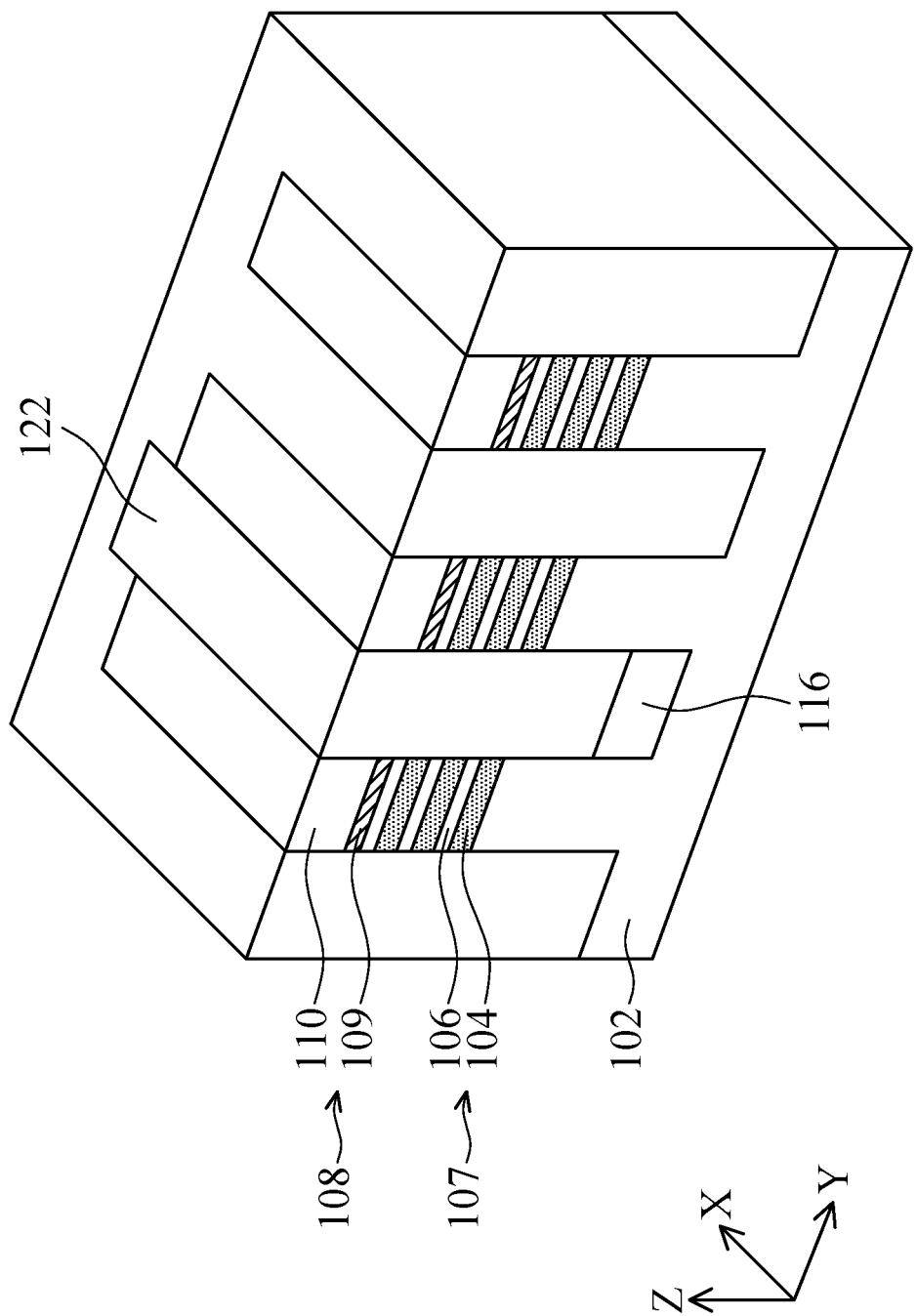
Figures 1, 1G:
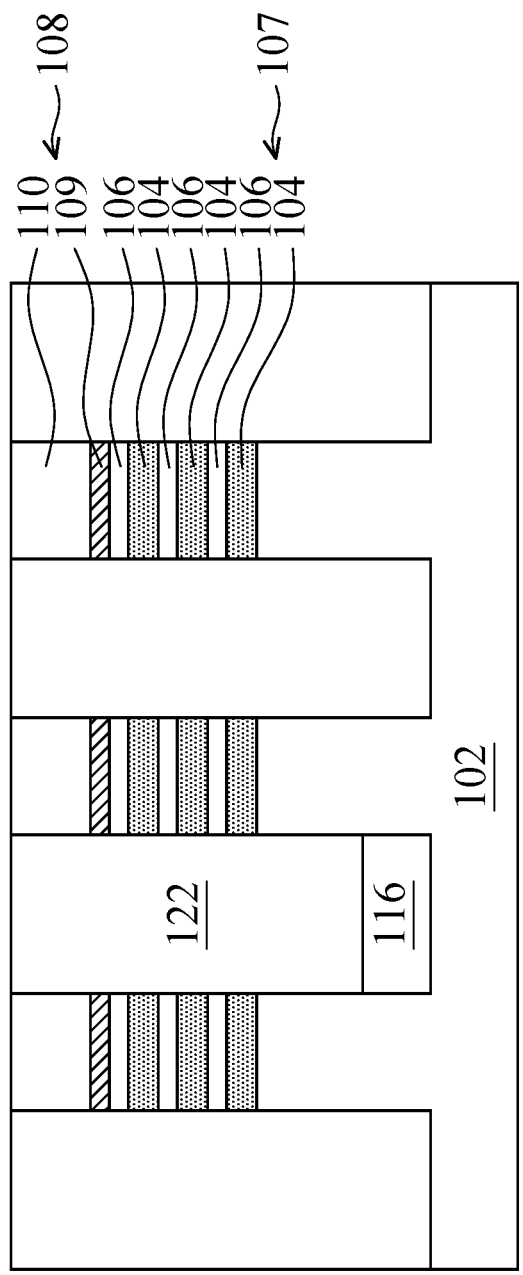
Figures 1, 1G, 2:
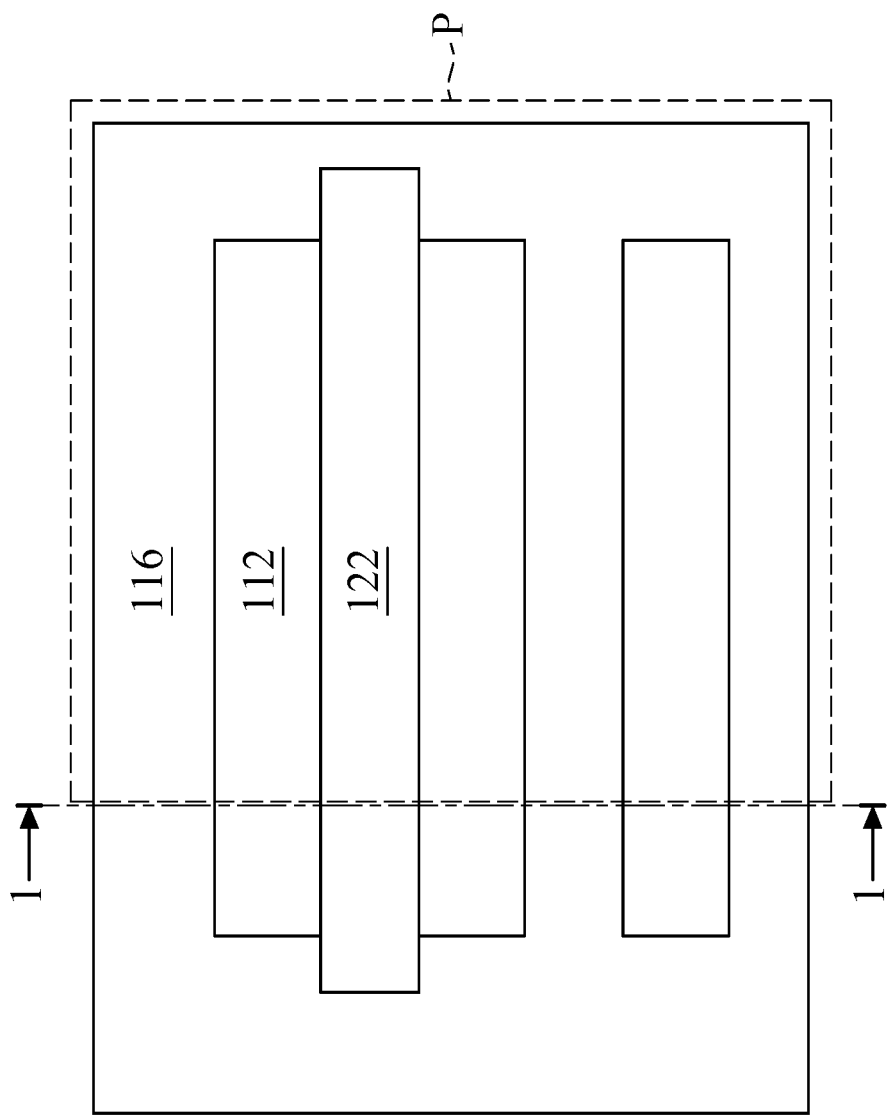

Afterwards, a planarization process such as a chemical mechanical polishing (CMP) process is performed to remove excess wall structure material 122, and a wall structure 122 is formed between the fin structures 112, as shown in FIGS. 1G, 1G-1 and 1G-2 in accordance with some embodiments. After the planarization process, the top surface of the wall structure 122 may be level with the top surface of the hard mask layer 110 over the fin structures 112. The height of the wall structure 122 may be controlled by the planarization process. The wall structure 122 may provide isolation between adjacent nanostructures 106.

Figure 1H:
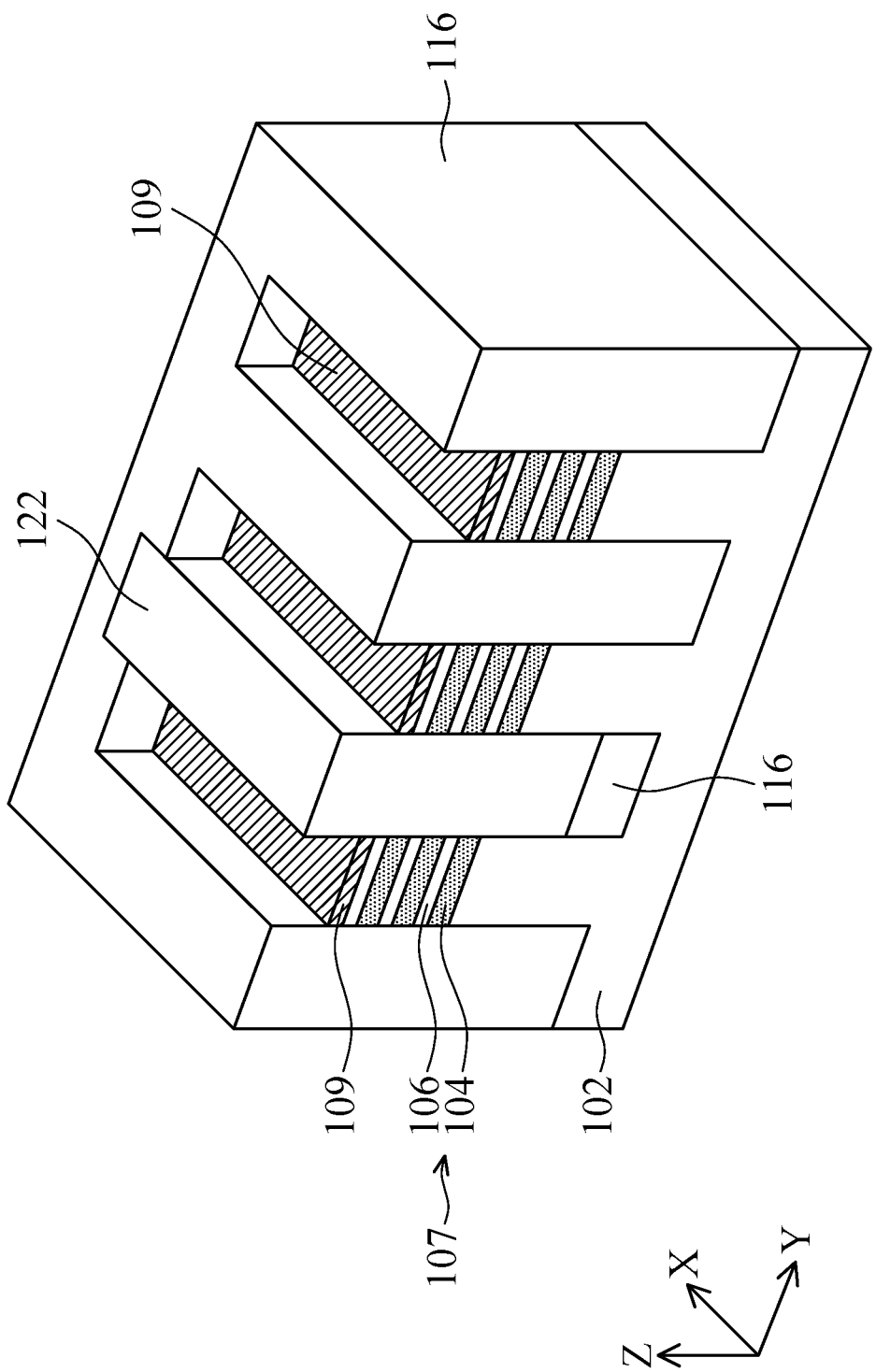
Figures 1, 1H:
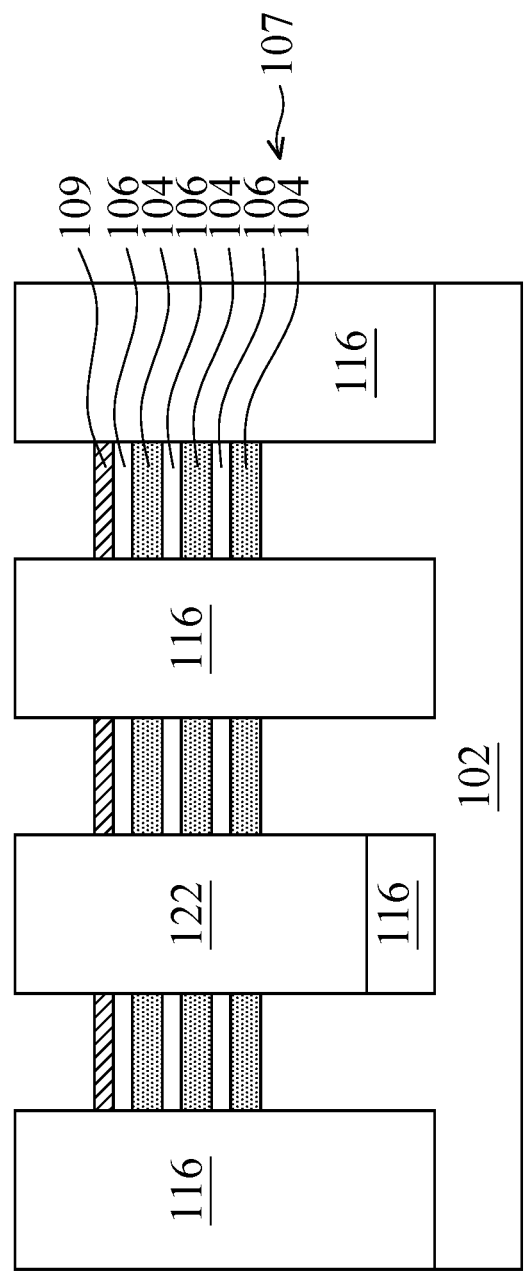
Figures 1, 1H, 2:
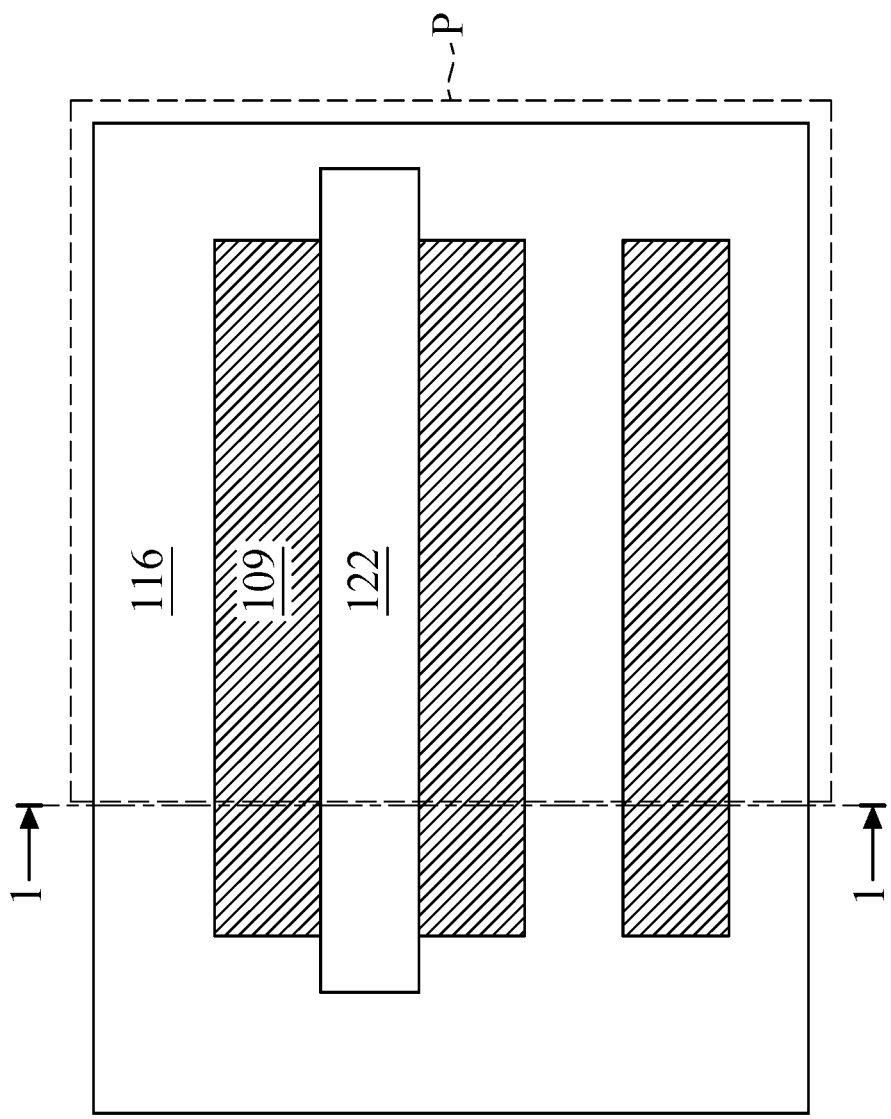

Next, the hard mask layer 110 over the fin structures 112 is removed, and the pad layer 109 over the fin structures 112 is exposed, as shown in FIGS. 1H, 1H-1 and 1H-2 in accordance with some embodiments. The hard mask layer 110 may be removed by performing an etching process. The etching processes may be dry etching, wet drying, reactive ion etching, or other applicable etching methods.

Figure 1I:
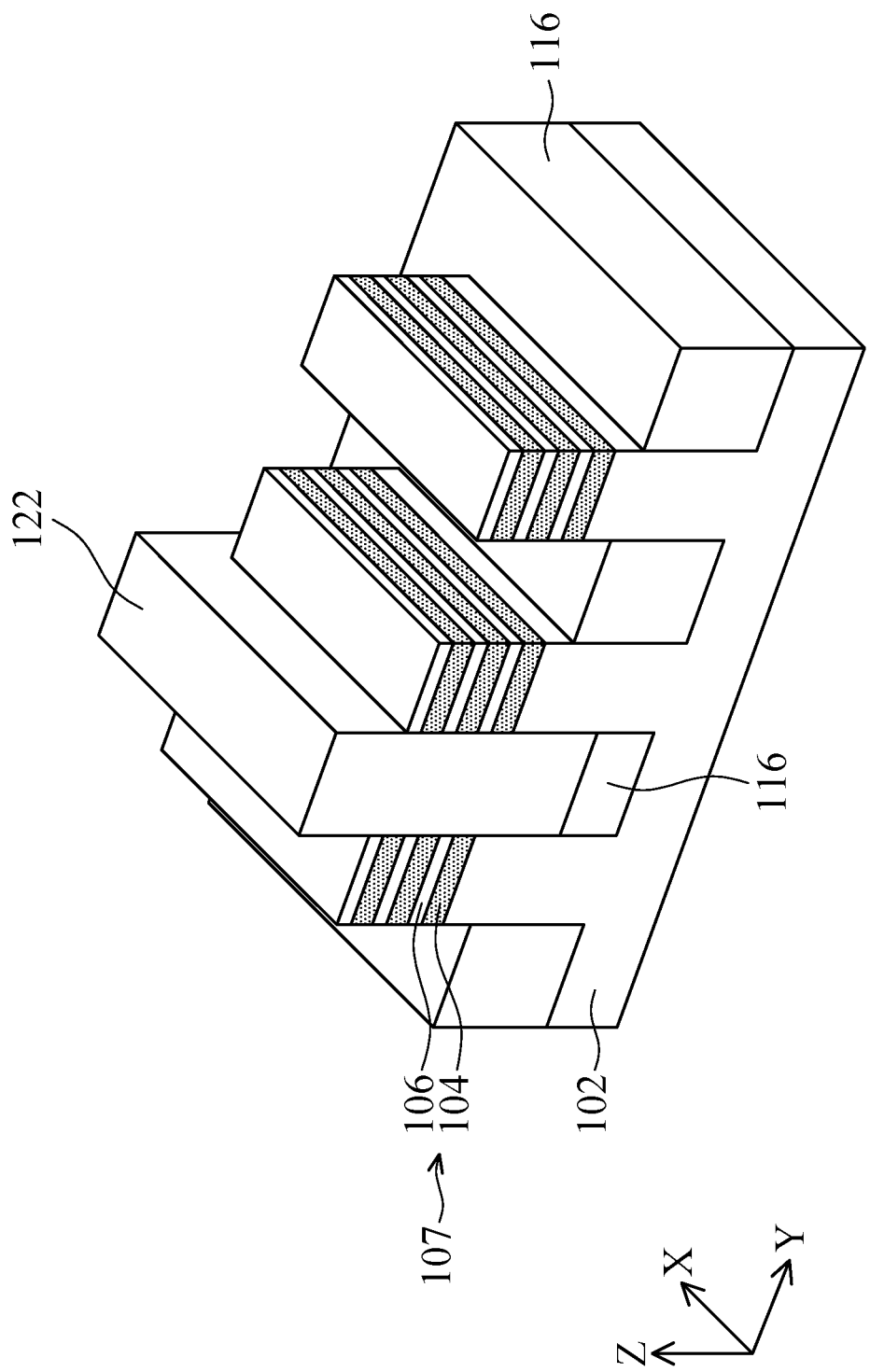
Figures 1, 1I:
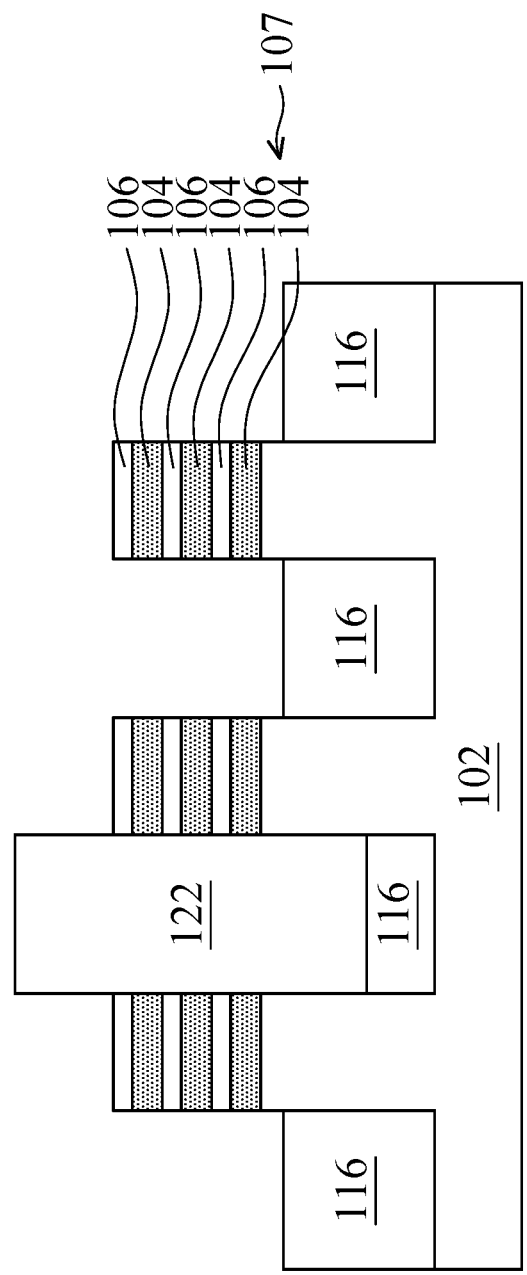

Next, the isolation material 116 is etched back using an etching process, and an isolation structure 116 is formed surrounding the base fin structure, as shown in FIGS. 1I, 1I-1 and 1I-2 in accordance with some embodiments. The etching process may be used to remove the top portion of the isolation material 116. In some embodiments, the isolation material 116 surrounding end portions of the wall structure 122 is etched back. The pad layer 109 over the fin structure 112 is removed in the etching process. As a result, the first semiconductor material layers 104 and the second semiconductor material layers 106 of the semiconductor stack 107 may be exposed. The isolation structure 116 may be a shallow trench isolation (STI) structure 116. The isolation structure 116 may be configured to electrically isolate active regions such as fin structures 112 of the semiconductor structure 10a and prevent electrical interference and crosstalk. In some embodiments, the top surface of the wall structure 122 is higher than top surfaces of adjacent semiconductor stack 107. The wall structure 122 may provide better isolation for subsequently formed semiconductor devices.

Figure 1J:
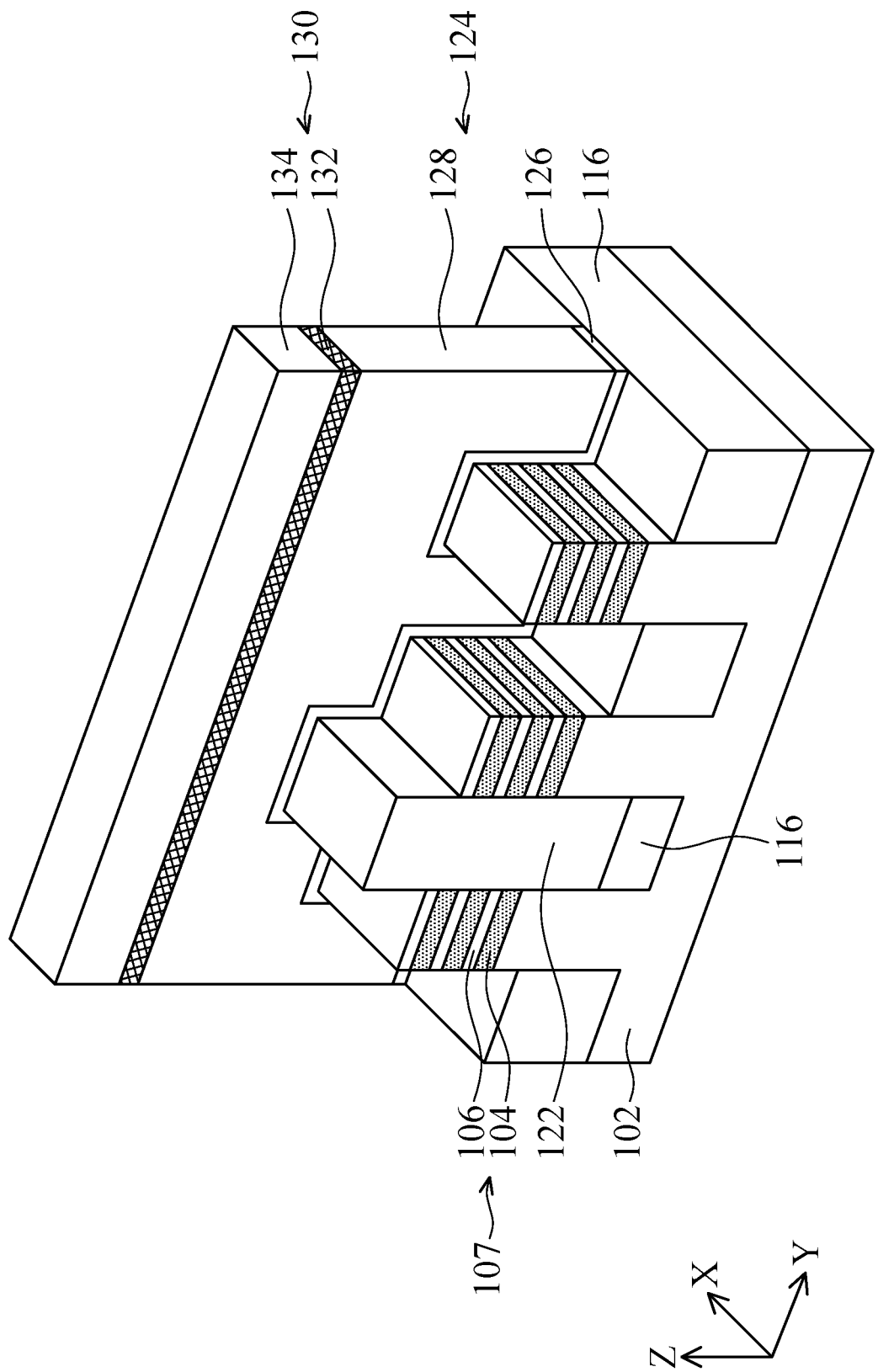

Next, a dummy gate structure 124 is formed over and across the fin structures 112, as shown in FIG. 1J in accordance with some embodiments. The dummy gate structure 124 may be used to define the source/drain regions and the channel regions of the resulting semiconductor structure 10a. The dummy gate structure 124 may include a dummy gate dielectric layer 126 and a dummy gate electrode layer 128. The dummy gate dielectric layer 126 and the dummy gate electrode layer 128 may be replaced by the following steps to form a real gate structure with a high-k dielectric layer and a metal gate electrode layer.

The dummy gate dielectric layer 126 may include one or more dielectric materials, such as silicon oxide, silicon nitride, silicon oxynitride (SiON), $HfO_2$, HfZrO, HfSiO, HfTiO, HfAlO, or a combination thereof. The dummy gate dielectric layer 126 may be formed by an oxidation process (e.g., a dry oxidation process, or a wet oxidation process), a chemical vapor deposition process, other applicable processes, or a combination thereof. Alternatively, the dummy gate dielectric layer 126 may include a high-k dielectric layer (e.g., the dielectric constant is greater than 3.9) such as hafnium oxide ($HfO_2$). Alternatively, the high-k dielectric layer may include other high-k dielectrics, such as LaO, AlO, ZrO, TiO, $Ta_2O_5$, $Y_2O_3$, $SrTiO_3$, $BaTiO_3$, BaZrO, HfZrO, HfLaO, HfTaO, HfSiO, HfSiON, HfTiO, LaSiO, AlSiO, $(Ba, Sr)TiO_3$, $Al_2O_3$, other applicable high-k dielectric materials, or a combination thereof. The high-k dielectric layer may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

The dummy gate electrode layer 128 may include polycrystalline-silicon (poly-Si), poly-crystalline silicon-germanium (poly-SiGe), other applicable materials, or a combination thereof. The dummy gate electrode layer 128 may be formed by a chemical vapor deposition process (e.g., a low pressure chemical vapor deposition process, or a plasma enhanced chemical vapor deposition process), a physical vapor deposition process (e.g., a vacuum evaporation process, or a sputtering process), other applicable processes, or a combination thereof.

Hard mask layers 130 are formed over the dummy gate structure 124, as shown in FIG. 1J in accordance with some embodiments. The hard mask layers 130 may include multiple layers, such as an oxide layer 132 and a nitride layer 134. In some embodiments, the oxide layer 132 includes silicon oxide, and the nitride layer 134 includes silicon nitride.

The formation of the dummy gate structure 124 may include conformally forming a dielectric material as the dummy gate dielectric layer 126. Afterwards, a conductive material may be formed over the dielectric material as the dummy gate electrode layers 120, and the bi-layered hard mask layers 130, including the oxide layer 132 and the nitride layer 134, may be formed over the conductive material. Next, the dielectric material and the conductive material may be patterned and etched through the bi-layered hard mask layers 130 to form the dummy gate structure 124, as shown in FIG. 1J in accordance with some embodiments. The dummy gate dielectric layer 126 and the dummy gate electrode layer 128 may be etched by a dry etching process. After the etching process, the first semiconductor material layers 104 and the second semiconductor material layers 106 may be exposed on opposite sides of the dummy gate structure 124.

Next, a conformal dielectric layer is formed over the substrate 102 and the dummy gate structure 124, and then an etching process is performed. A pair of spacer layers 136 is formed over opposite sidewalls of the dummy gate structure 124, and a source/drain opening is formed beside the dummy gate structure 124, as shown in FIG. 1K in accordance with some embodiments.

The spacer layers 136 may be multi-layer structures formed by different materials with different etching selectivity. The spacer layers 136 may be made of silicon oxide, silicon nitride, silicon oxynitride, and/or dielectric materials. The spacer layers 136 may be formed by a chemical vapor deposition (CVD) process, a spin-on-glass process, or another applicable process.

Figure 1K:
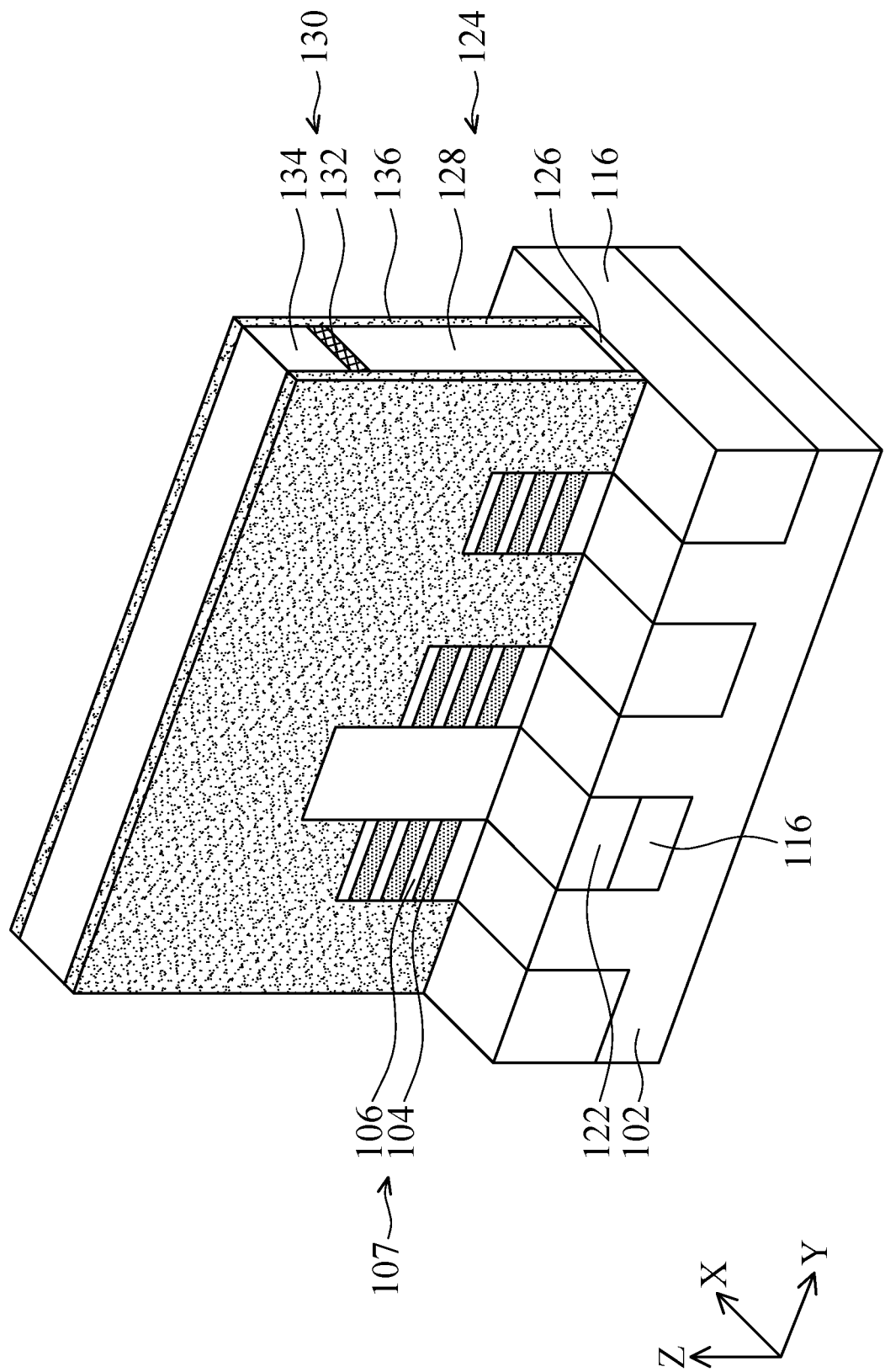

After the spacer layers 136 are formed, the first semiconductor material layers 104 and the second semiconductor material layers 106 of the fin structures 112 not covered by the dummy gate structure 124 and the spacer layers 136 are etched to form the trenches beside the dummy gate structure 124, as shown in FIG. 1K in accordance with some embodiments.

The fin structures 112 may be recessed by performing a number of etching processes. That is, the first semiconductor material layers 104 and the second semiconductor material layers 106 of the fin structures 112 may be etched in different etching processes. The etching process may be a dry etching process or a wet etching process. The fin structures 112 may be etched by a dry etching process.

Next, the first semiconductor material layers 104 may be laterally etched from the source/drain opening to form recesses. The outer portions of the first semiconductor material layers 104 may be removed, and the inner portions of the first semiconductor material layers 104 under the dummy gate structure 124 and the spacer layers 136 may remain. After the lateral etching process, the sidewalls of the etched first semiconductor material layers 104 may be not aligned with the sidewalls of the second semiconductor material layers 106.

The lateral etching of the first semiconductor material layers 104 may be a dry etching process, a wet etching process, or a combination thereof. In some embodiments, the first semiconductor material layers 104 are Ge or SiGe and the second semiconductor material layers 106 are Si, and the first semiconductor material layers 104 are selectively etched to form the recesses by using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions, or the like.

Next, an inner spacer 137 may be formed in the recess (shown in subsequent figures). The inner spacer 137 may provide a barrier between subsequently formed source/drain epitaxial structures and gate structure. The inner spacer 137 may be made of dielectric material such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof. The inner spacer 137 may be formed using a deposition process. The deposition process may include a CVD process (such as LPCVD, PECVD, SACVD, or FCVD), an ALD process, another applicable method, or a combination thereof.

Figure 1L:
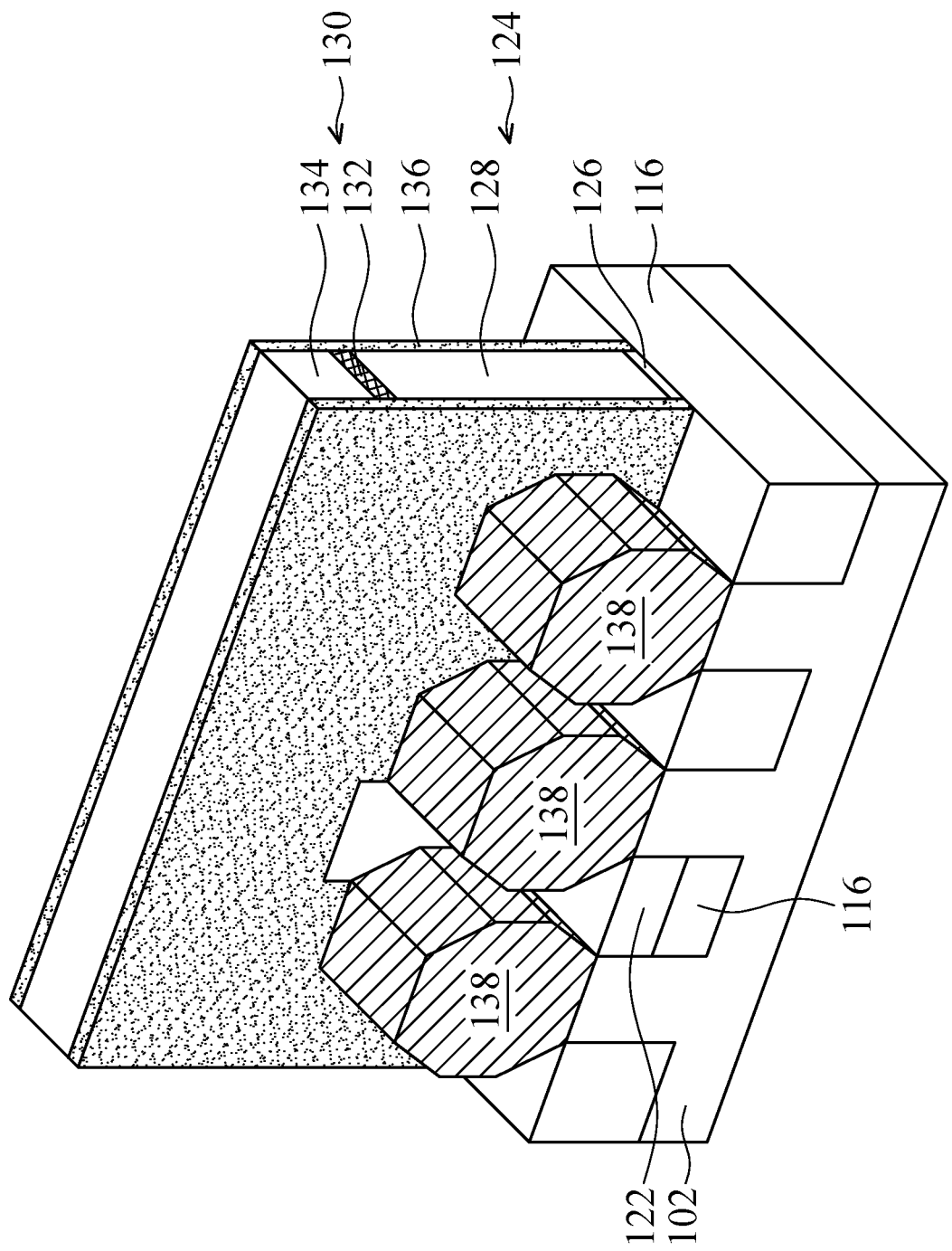

Next, a source/drain epitaxial structure 138 is formed in the source/drain opening, as shown in FIG. 1L in accordance with some embodiments. The source/drain epitaxial structure 138 may be formed over opposite sides of the dummy gate structure 124. Source/drain epitaxial structures 138 may refer to a source or a drain, individually or collectively dependent upon the context.

A strained material may be grown in the source/drain opening using an epitaxial (epi) process to form the source/drain epitaxial structure 138. In addition, the lattice constant of the strained material may be different from the lattice constant of the substrate 102. The source/drain epitaxial structure 138 may include SiGeB, SiP, SiAs, SiGe, other applicable materials, or a combination thereof. The source/drain epitaxial structure 138 may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable method.

The source/drain epitaxial structure 138 may be in-situ doped during the epitaxial growth process. For example, the source/drain epitaxial structures 138 may be the epitaxially grown SiGe doped with boron (B). For example, the source/drain epitaxial structure 138 may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features. The source/drain epitaxial structure 138 may be doped in one or more implantation processes after the epitaxial growth process.

Next, a contact etch stop layer 139 may be formed over the source/drain epitaxial structure 138. More specifically, the contact etch stop layer 139 may cover the sidewalls of the spacer layers 136 and the source/drain epitaxial structures 138. The contact etch stop layer 139 may be made of a dielectric material such as silicon nitride, silicon oxide, silicon oxynitride (SiON), other applicable materials, or a combination thereof. The contact etch stop layer 139 may be formed by a chemical vapor deposition process (e.g., a plasma enhanced chemical vapor deposition (PECVD) process, or a metalorganic chemical vapor deposition (MOCVD) process), an atomic layer deposition (ALD)

process (e.g., a plasma enhanced atomic layer deposition (PEALD) process), a physical vapor deposition (PVD) process (e.g., a vacuum evaporation process, or a sputtering process), other applicable processes, or a combination thereof.

Figure 1M:
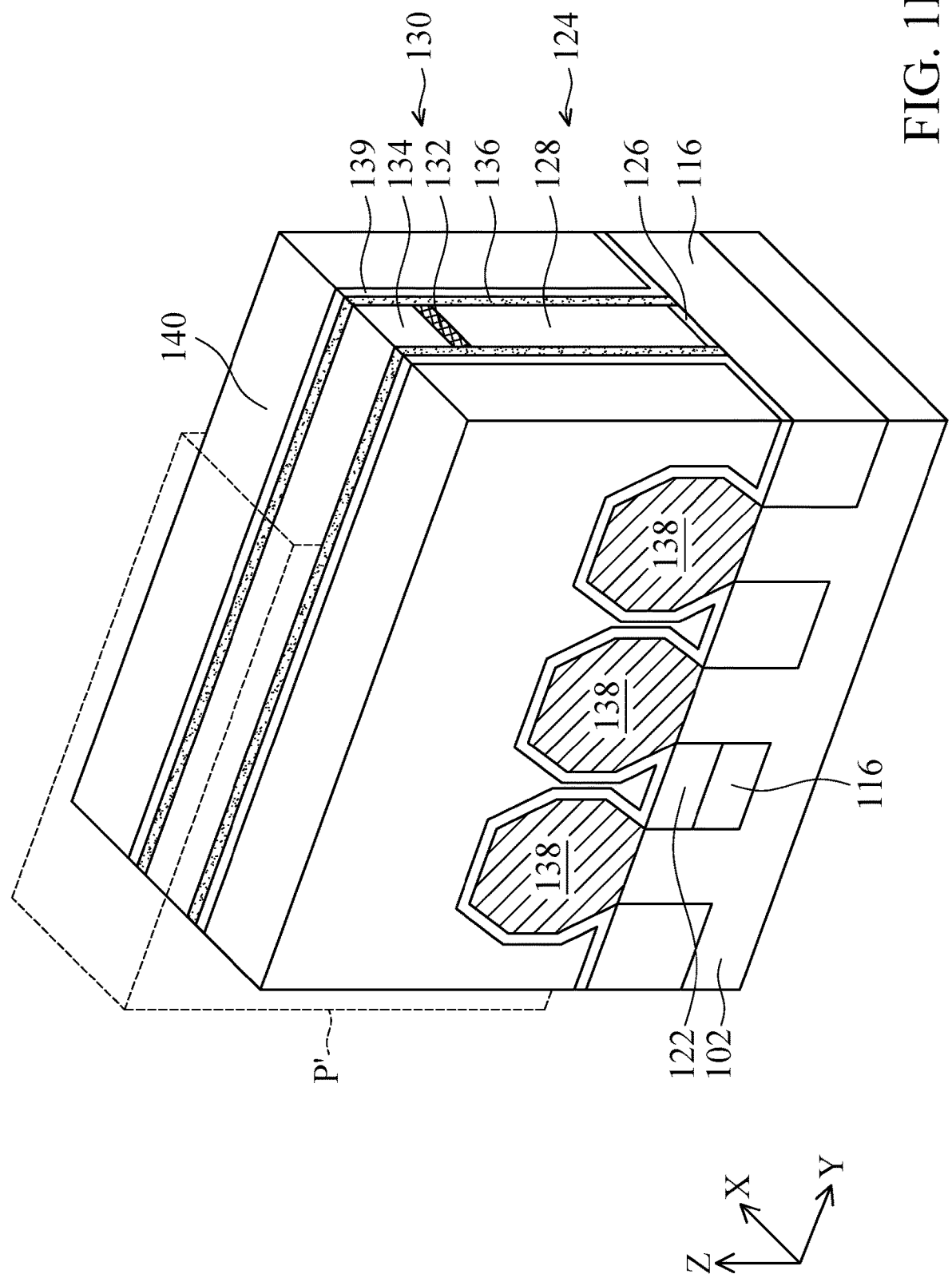

After the contact etch stop layer 139 is formed, an inter-layer dielectric (ILD) structure 140 is formed over the source/drain epitaxial structure 138, as shown in FIG. 1M in accordance with some embodiments. The ILD structure 140 may include multilayers made of multiple dielectric materials, such as silicon oxide ($SiO_x$, where x may be a positive integer), silicon oxycarbide ($SiCO_y$, where y may be a positive integer), silicon oxycarbonitride ($SiNCO_z$, where z may be a positive integer), silicon nitride, silicon oxynitride, phosphosilicate glass (PSG), borophosphosilicate glass (BPSG), low-k dielectric material, or another applicable dielectric material. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD structure 140 may be formed by chemical vapor deposition (CVD), physical vapor deposition (PVD), atomic layer deposition (ALD), spin-on coating, or another applicable process.

Afterwards, a planarizing process or an etch-back process may be performed on the ILD structure 140 until the top surface of the dummy gate structure 124 is exposed. After the planarizing process, the top surface of the dummy gate structure 124 may be substantially level with the top surfaces of the spacer layers 136 and the ILD structure 140. The planarizing process may include a grinding process, a chemical mechanical polishing (CMP) process, an etching process, other applicable processes, or a combination thereof.

Figure 1N:
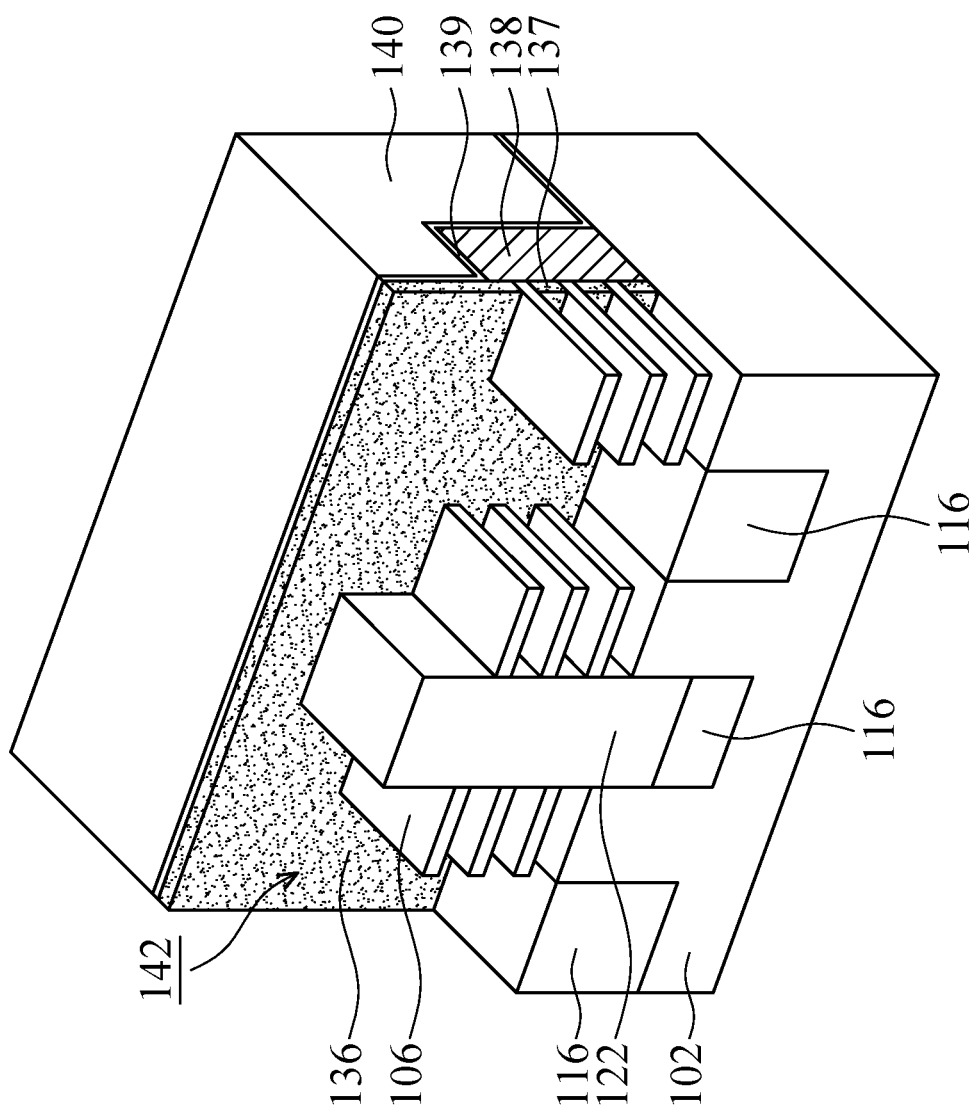
Figure 1O:
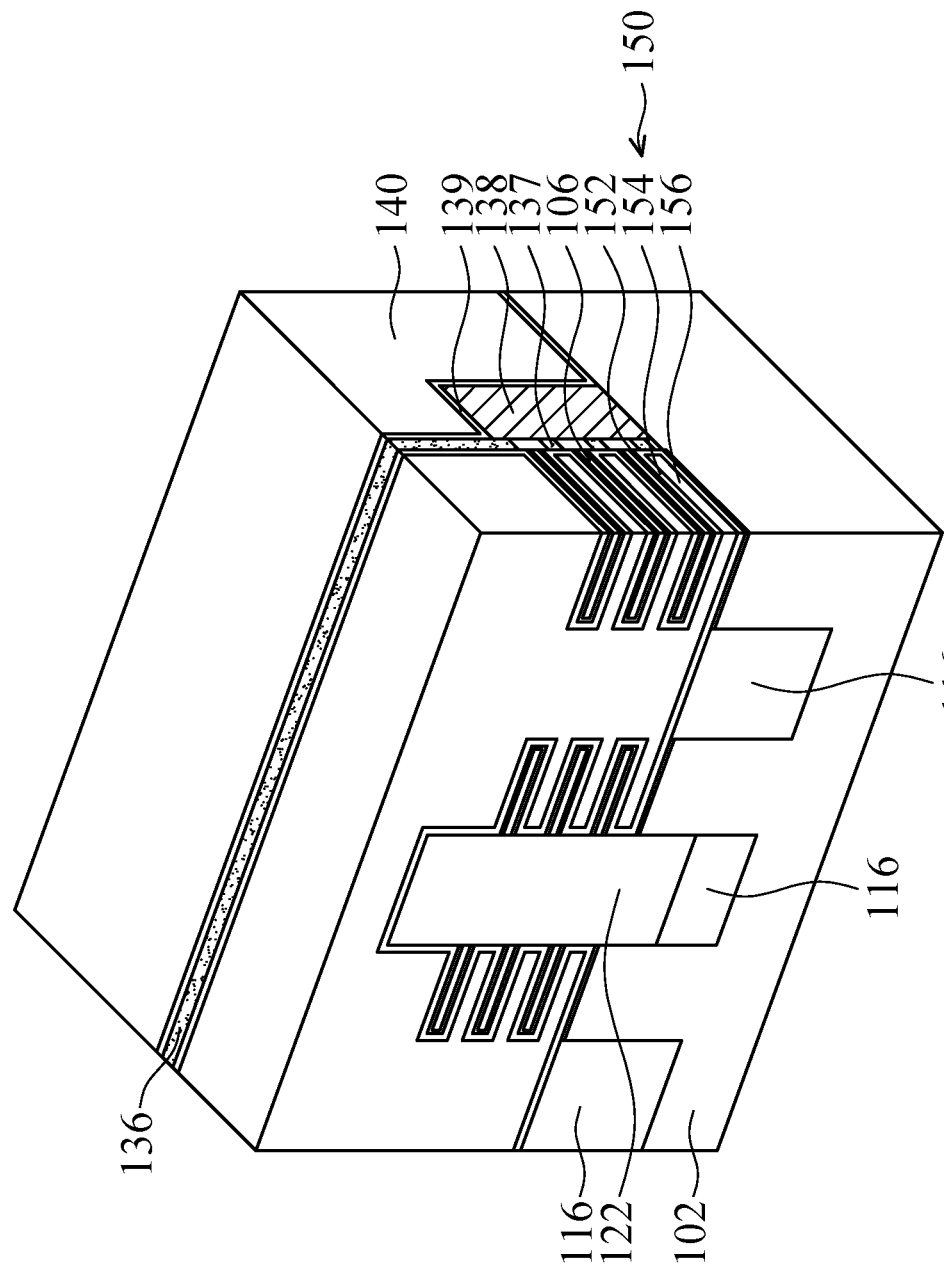

FIGS. 1N and 1O show perspective representations of the dashed box P' shown in FIG. 1M in the following stages of forming a semiconductor device structure 10a.

Next, the dummy gate structure 124 is removed, as shown in FIG. 1N in accordance with some embodiments. Therefore, a trench 142 is formed between the spacer layers 136 over the fin structures 112 and the first semiconductor material layers 104 are exposed from the trench 142.

The dummy gate structure 124 may be removed by a dry etching process or a wet etching process. The removal process may include one or more etching processes. For example, when the dummy gate electrode layers 120 are polysilicon, a wet etchant such as a tetramethylammonium hydroxide (TMAH) solution may be used to selectively remove the dummy gate electrode layers 120. Afterwards, the dummy gate dielectric layer 126 may be removed using a plasma dry etching, a dry chemical etching, and/or a wet etching.

Next, the first semiconductor material layers 104 are removed and gaps are formed between the first semiconductor material layers 104, as shown in FIG. 1N in accordance with some embodiments. More specifically, the second semiconductor material layers 106 exposed by the gaps form nanostructures 106, and the nanostructures 106 are configured to function as channel regions in the resulting semiconductor devices 10a in accordance with some embodiments.

The first semiconductor material layers 104 may be removed by performing one or more etching processes. The etching process may include a selective wet etching process, such as APM (e.g., ammonia hydroxide-hydrogen peroxide-water mixture) etching process. The wet etching process uses etchants such as ammonium hydroxide ($NH_4OH$), TMAH, ethylenediamine pyrocatechol (EDP), and/or potassium hydroxide (KOH) solutions.

Next, a gate structures 150 are formed surrounding the nanostructures 106 and over the nanostructures 106, as shown in FIG. 1O in accordance with some embodiments. Gate structures 150 are formed surrounding the nanostructures 106 to form gate-all-around (GAA) transistor structures. Therefore, the gate control ability may be enhanced.

In some embodiments as shown in FIG. 1O, the gate structures 150 are multi-layered structures. Each of the gate structures 150 may include an interfacial layer 152, a gate dielectric layer 154, a work function layer 156, and a gate electrode layer.

The interfacial layer 152 may be formed around the nanostructures 106 and on the exposed portions of the base fin structures. The interfacial layer 152 may be made of silicon oxide, and the interfacial layer 152 may be formed by thermal oxidation.

The gate dielectric layer 154 is formed over the interfacial layer 152, so that the nanostructures 106 are surrounded (e.g. wrapped) by the gate dielectric layer 154. In addition, the gate dielectric layer 154 also covers the sidewalls of the spacer layers 136 and the inner spacers 137 in accordance with some embodiments. The gate dielectric layer 154 may be made of one or more layers of dielectric materials, such as $HfO_2$, HfSiO, HfSiON, HfTaO, HfTiO, HfZrO, zirconium oxide, aluminum oxide, titanium oxide, hafnium dioxide-alumina ($HfO_2$—$Al2O_3$) alloy, other applicable high-k dielectric materials, or a combination thereof. The gate dielectric layer 154 may be formed using CVD, ALD, other applicable methods, or a combination thereof.

Next, the work function layer 156 is conformally formed over the gate dielectric layer 154, as shown in FIG. 1O in accordance with some embodiments. The work function layer 156 may be made of a metal material. The metal material of the work function layer 156 may include an N-work-function metal. The N-work-function metal may include tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), or a combination thereof. The work function layer 156 may be formed by using CVD, ALD, other applicable methods, or a combination thereof.

The metal material of the work function layer 156 may include a P-work-function metal. The P-work-function metal may include titanium nitride (TiN), tungsten nitride (WN), tantalum nitride (TaN), ruthenium (Ru) or a combination thereof. The work function layer 156 may be formed by using CVD, ALD, other applicable methods, or a combination thereof.

Next, a gate electrode layer may be formed over the work function layer 156. The gate electrode layer may be made of one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. The gate electrode layer may be formed using CVD, ALD, electroplating, another applicable method, or a combination thereof. After the gate electrode layer is formed, a planarization process such as CMP or an etch-back process may be performed.

Figure 1P:
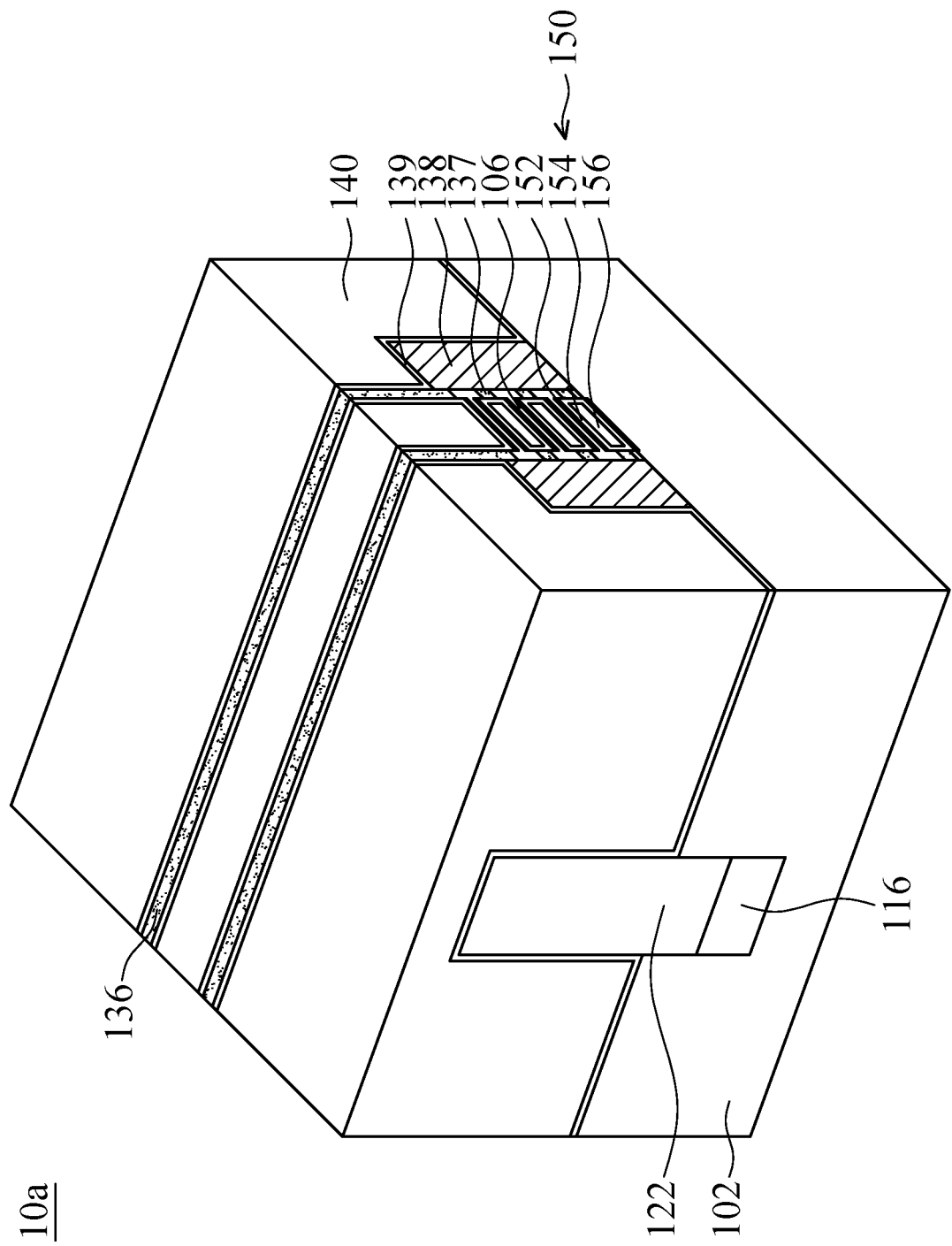
Figures 1, 1P:
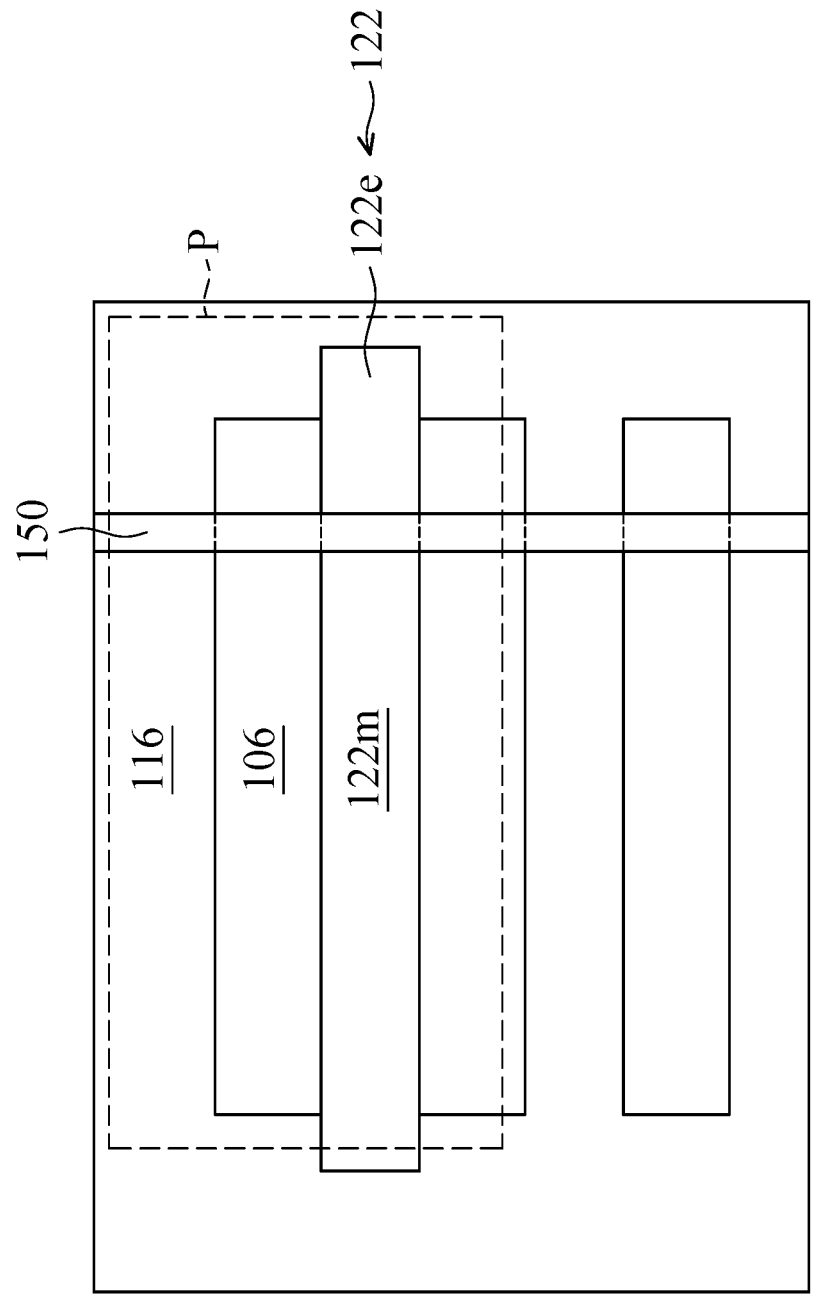

The wall structure 122 has a main portion 122m formed between the nanostructures 106 and an extending portion 122e laterally protruding out of the sidewalls of the nanostructures 106, as shown in FIGS. 1P and 1P-1 in accordance with some embodiments. In some embodiments, the wall structure 122 is longer than the nanostructures 106 in the top view. In some embodiments, the wall structure 122 extends in the isolation structure 116 surrounding the nanostructures 106. The extending portion 122e of the wall structure 122 may mitigate shrinkage at the end portion of the wall structure 122.

The nanostructures 106 on opposite sides of the wall structure 122 may be the channel regions of different transistors. The nanostructures 106 on opposite sides of the wall structure 122 may have the same conductivity type. The nanostructures 106 on opposite sides of the wall structure 122 may have different conductivity type.

With an extending portion 122e protruding out of the nanostructures 106, the wall structure 122 may not be shrunk at the end of the wall structure 122.

Many variations and/or modifications may be made to the embodiments of the disclosure. FIGS. 2A-2G are perspective representations of various stages of forming a semiconductor device structure 10b, in accordance with some embodiments of the disclosure. Some processes or devices are the same as, or similar to, those described in the embodiments above, and therefore the descriptions of these processes and devices are not repeated herein. The difference from the embodiments described above is that, as shown in FIGS. 2A-2B in accordance with some embodiments, the wall structure material 122 is formed over the fin structures 112.

Figure 2A:
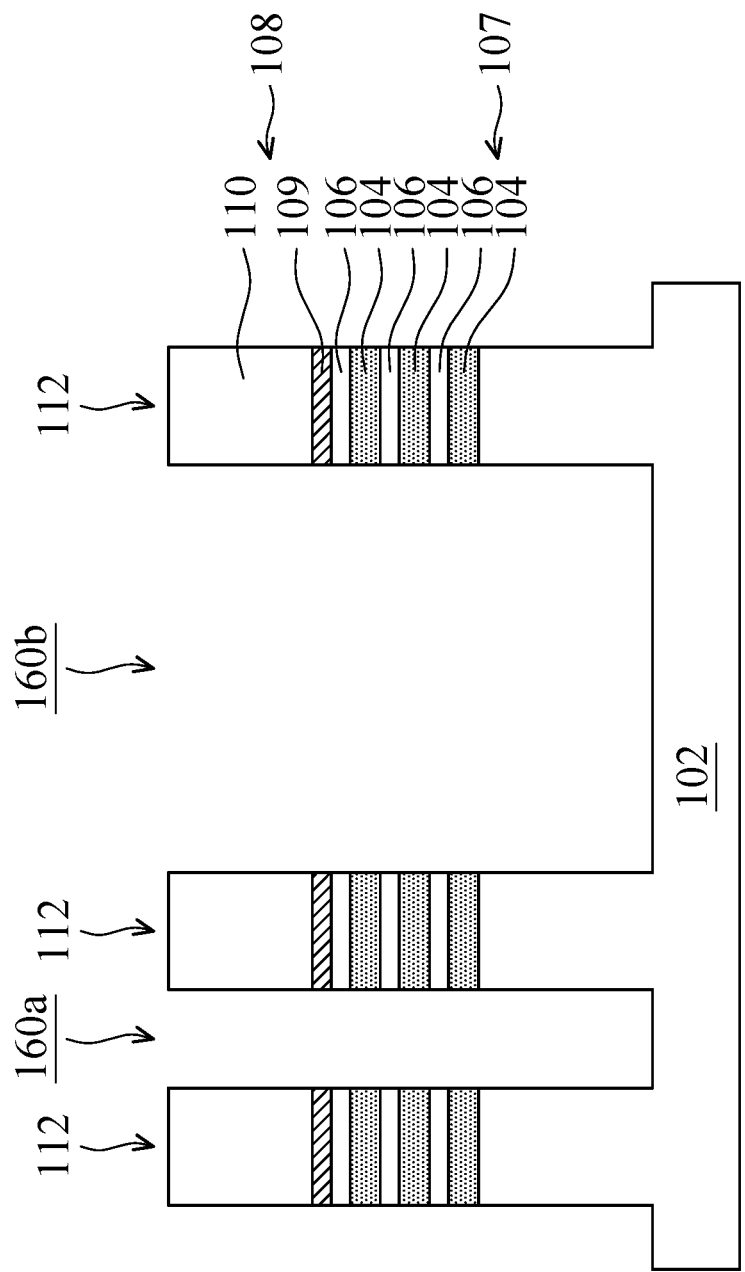

The fin structures 112 are formed over the substrate 102, as shown in FIG. 2A in accordance with some embodiments. Openings 160a and 160b are formed between fin structures 112. The space between adjacent fin structures 112 may be different. For example, the opening 160a is narrower than the opening 160b.

Figure 2B:
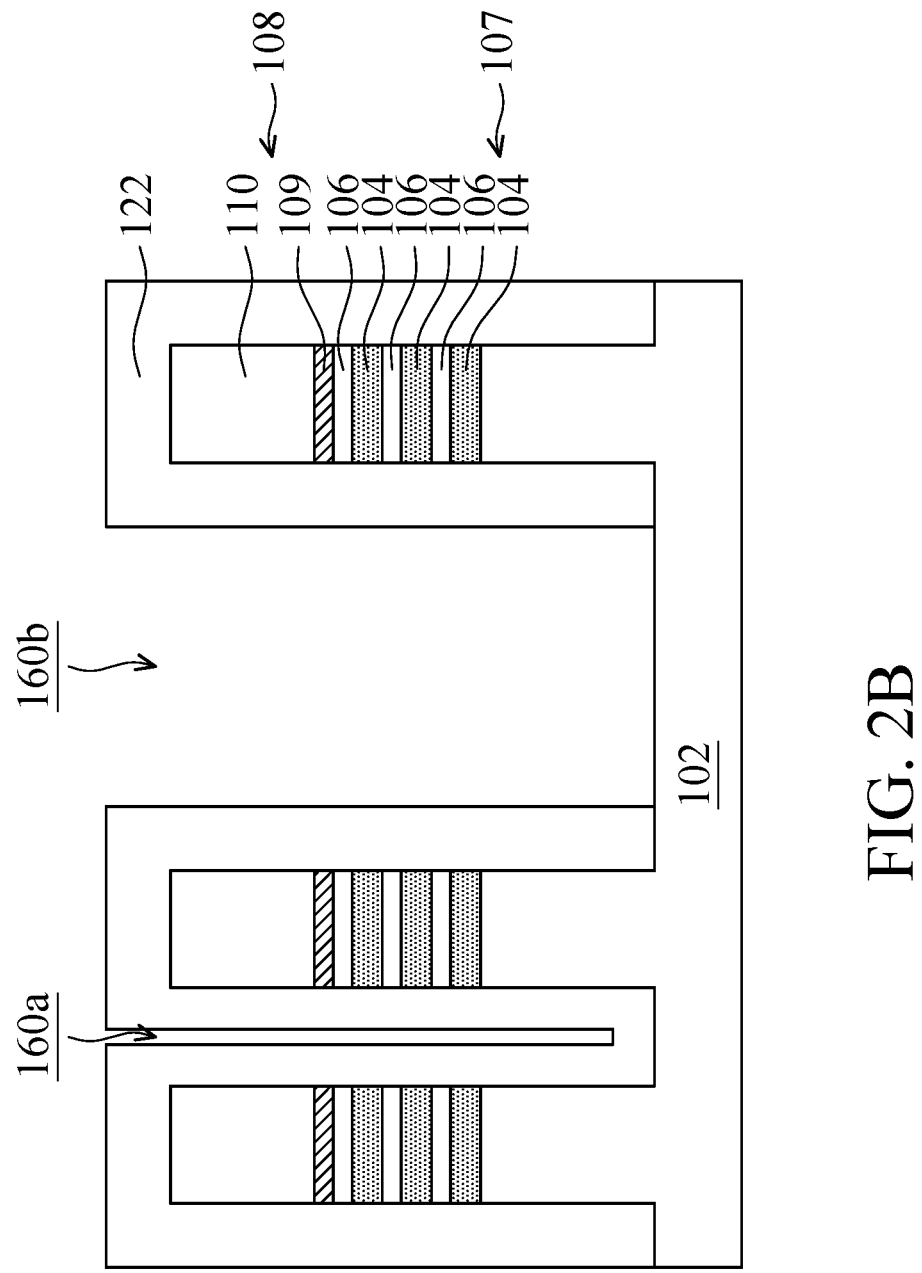

Afterwards, the wall structure material 122 is conformally formed over the fin structures 112, and an etching process is performed to remove the wall structure material 122, as shown in FIG. 2B in accordance with some embodiments. Since the opening 160a is narrower than the opening 160b, the wall structure material 122 may remain at the bottom of the opening 160a, while the wall structure material 122 formed over the substrate 102 in the opening 160b may be removed.

The wall structure material 122 may include SiN, SiCN, SiOC, SiOCN, other suitable materials, or a combination thereof. The wall structure material 122 may be formed using CVD, ALD, other applicable methods, or a combination thereof. The etching process may be a dry etching process or a wet etching process. The wall structure material 122 may be removed by a dry etching process.

Figure 2C:
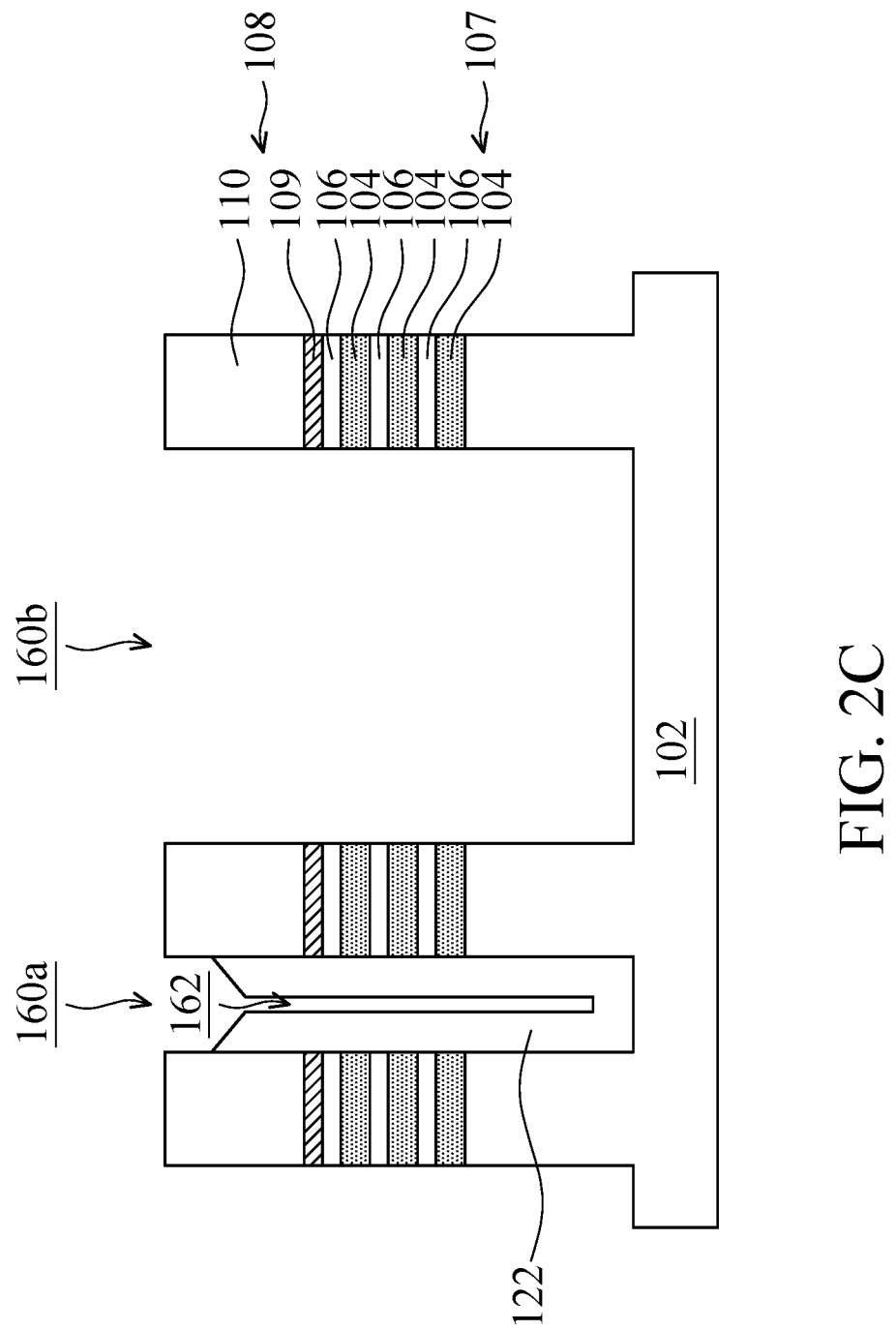

Next, an etching process is performed to remove the wall structure material 122, as shown in FIG. 2C in accordance with some embodiments. Since the opening 160a is narrower than the opening 160b, the wall structure material 122 may remain in the opening 160a, and the wall structure 122 may be formed in the opening 160a. The etching process may be a dry etching process or a wet etching process. The wall structure material 122 may be removed by a dry etching process.

In some embodiments, a seam 162 is formed in the wall structure 122. In some embodiments, the top surface of the wall structure 122 near the fin structures 122 is higher than the top surface of the wall structure 122 at the middle near the seam 162. In some embodiments, the wall structure 122 has a concave top surface. In some embodiments, the top surface of the wall structure 122 is lower than the top surface of the fin structures 112.

Figure 2D:
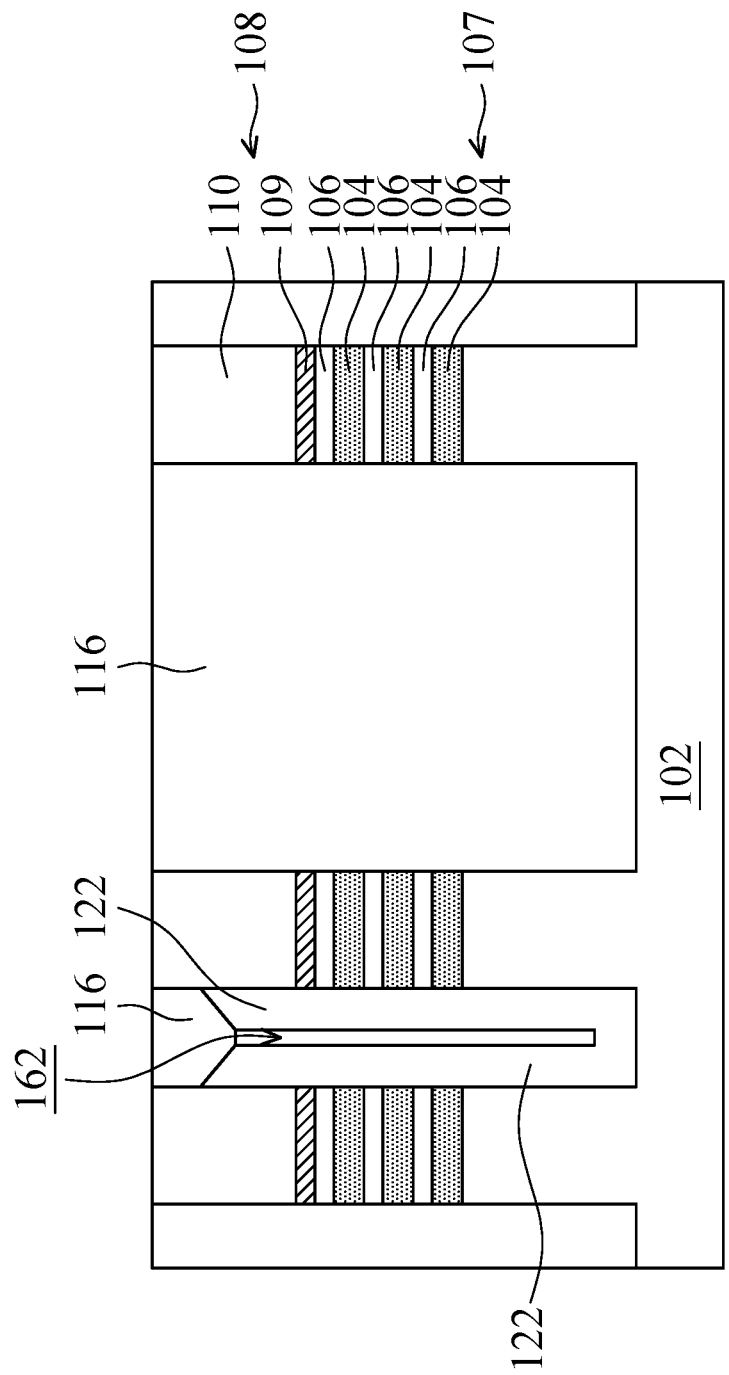

Next, the isolation material 116 is formed between the fin structures 112 and over the wall structure 122, as shown in FIG. 2D in accordance with some embodiments. In some embodiments, the seam 162 remains after the isolation material 116 is deposited. The processes and materials for forming the isolation material 116 may be the same as, or similar to, those used to form the isolation material 116 in the previous embodiments. For the purpose of brevity, the descriptions of these processes and materials are not repeated herein.

Figure 2E:
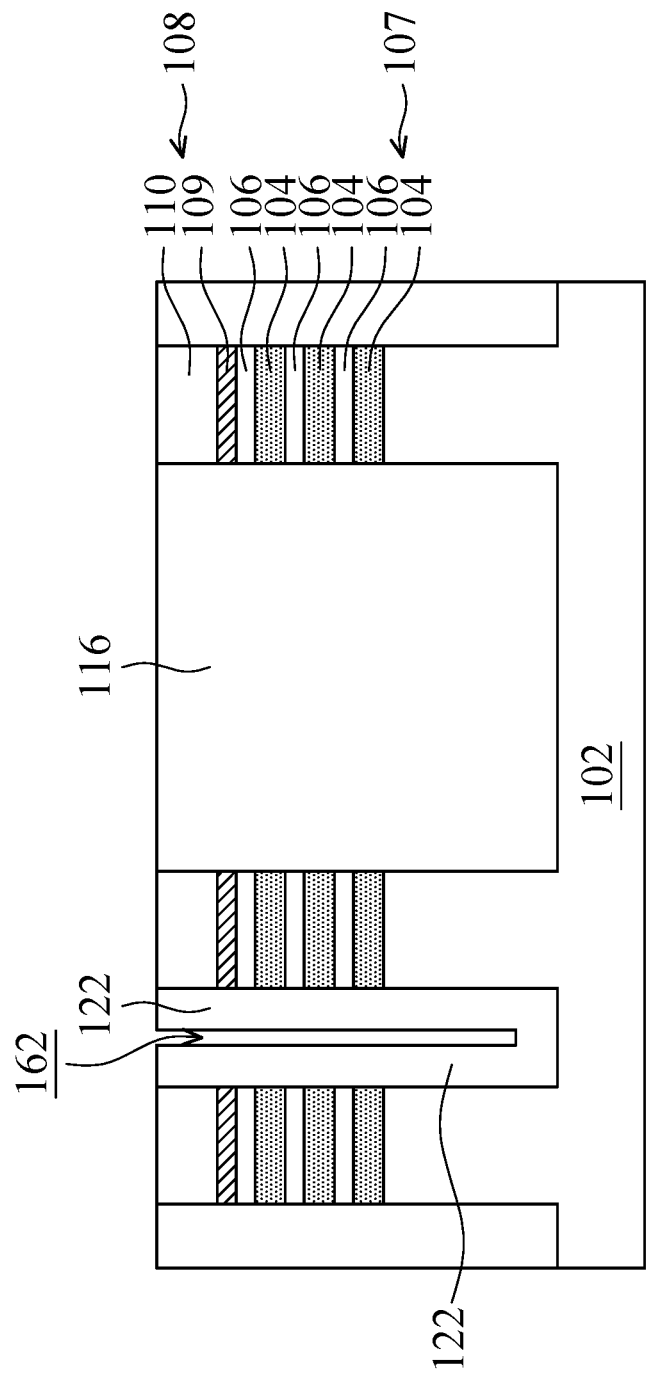

Next, a planarization process such as a CMP process is performed to remove the isolation material 116 over the wall structure 122, as shown in FIG. 2E in accordance with some embodiments. After the planarization process, the seam 162 in the wall structure 122 may be exposed.

Figure 2F:
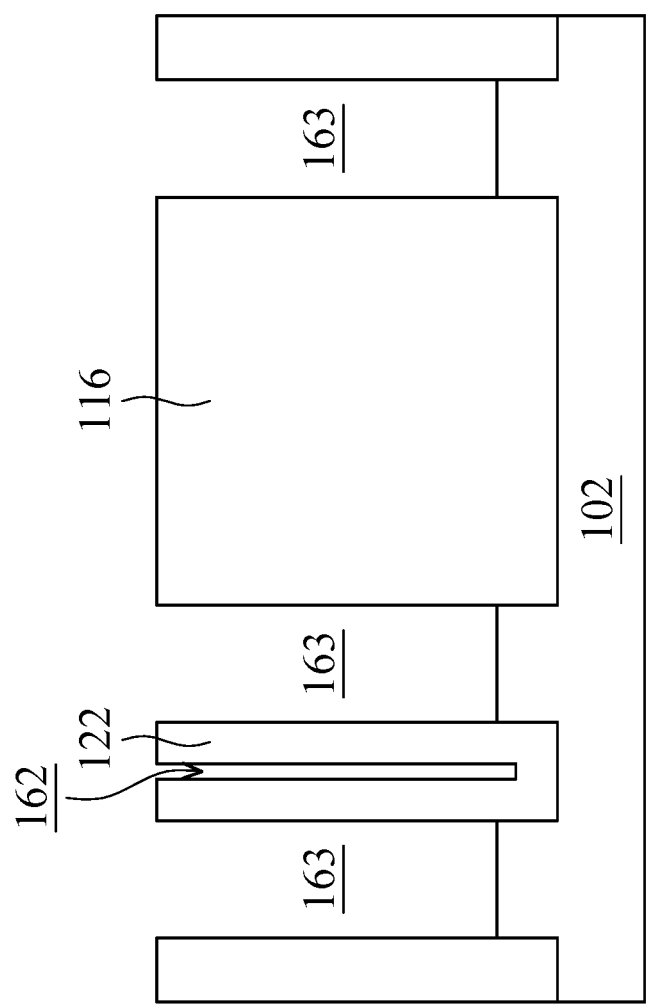

Afterwards, the semiconductor stack 107 is removed, and openings 163 are formed between the isolation material 116 and the wall structure 122, as shown in FIG. 2F in accordance with some embodiments. In some embodiments, the end portion of the semiconductor stack 107 is removed in a top view. The openings 163 may also be formed in the isolation material 116. The semiconductor stack 107 may be removed by a dry etching process using Cl-based or F-based chemicals. The semiconductor stack 107 may be removed by a wet etching using etchant such as ammonia.

Next, a filling material 166 may be formed in the opening 164 and over the isolation structure 116 and the wall structure. In some embodiments, the filling material 166 is formed surrounding the wall structure 122. The filling material 166 may be made of dielectric materials such as silicon nitride, silicon oxide, silicon oxynitride (SiON), other applicable materials, or a combination thereof. The filling material 166 may be formed using CVD, ALD, other applicable methods, or a combination thereof.

Figures 1, 2G:
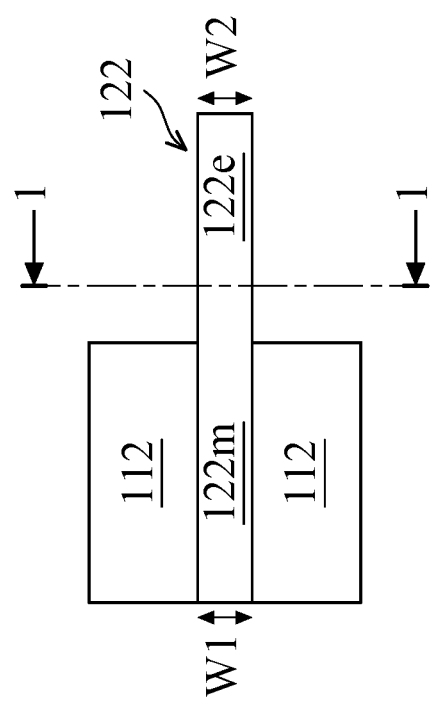

Afterwards, a planarization process such as a CMP process is performed to remove excess filling material 166, and a filling structure 166 is formed between the isolation material 116 and the wall structure 122, as shown in FIG. 2G in accordance with some embodiments. The filling structure 166 may be also formed in the isolation material 116. After the planarization process, the top surface of the filling structure 166 may be level with the top surface of the wall structure 122 and the isolation structure 116.

FIG. 2G shows cross-sectional representations taken along line 1-1 in FIG. 2G-1. The wall structure 122 includes an extending portion 122e protruding from the sidewalls of the fin structures 112. The extending portion 122e of the wall structure 122 may be formed by a self-aligned process when removing the end portion of the fin structures 112. Therefore, the production cost of forming the extending portion 122e of the wall structure 122 may be reduced. In some embodiments, the width W2 of extending portion 122e of the wall structure 122 is substantially the same as the width W1 of the main portion 122m of the wall structure 122.

With an extending portion 122e protruding out of the nanostructures 106, the wall structure 122 may not be shrunk at the end of the wall structure 122. The wall structure 122 with the extending portion 122e may be formed by a self-aligned process when removing end portions of the fin structures 112.

Figure 3:
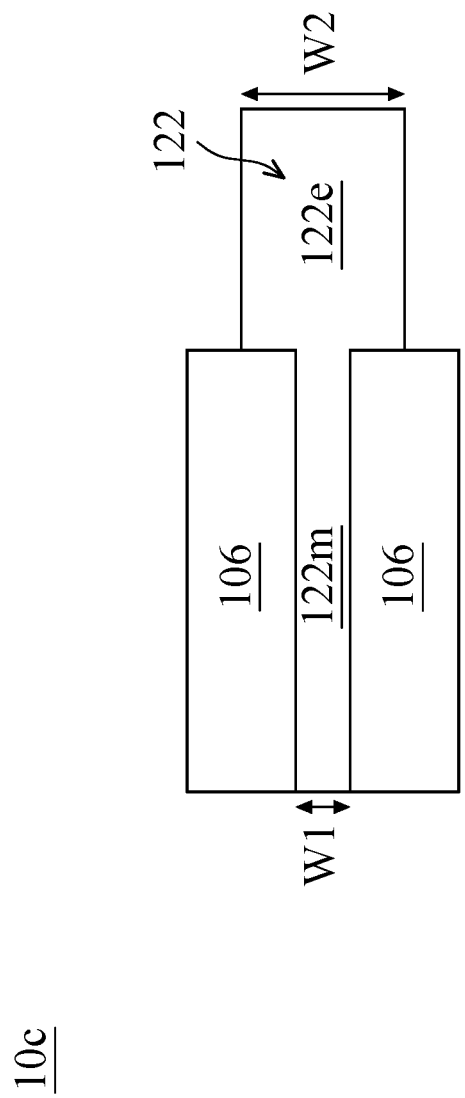
FIG. 3 is a top view of a semiconductor device structure, in accordance with some embodiments of the disclosure.

Many variations and/or modifications may be made to the embodiments of the disclosure. FIG. 3 is a top view of a semiconductor device structure 10c, in accordance with some embodiments of the disclosure. Some processes or devices are the same as, or similar to, those described in the embodiments above, and therefore the descriptions of these processes and devices are not repeated herein. The difference from the embodiments described above is that, the extending portion 122e of the wall structure 122 is wider than the main portion 122m of the wall structure 122.

In some embodiments, the width W2 of the extending portion 122e of the wall structure 122 is greater than the width W1 of the main portion 122m of the wall structure 122. The shape and dimension of the wall structure 122 in the top view may be defined by patterning the photoresist layer 118 shown in FIG. 1D. The width W2 of the extending portion 122e the wall structure 122 may be different from the width W1 the main portion 122m of the wall structure 122. In some embodiments, the width W2 of the extending portion 122e the wall structure 122 is equal to or smaller than the sum of the width W1 the main portion 122m of the wall structure 122 and the total widths of each of the nanostructures 106.

In some embodiments, the width W1 the main portion 122m of the wall structure 122 is in a range of about 5 nm to about 50 nm. In some embodiments, the width W2 of the extending portion 122e the wall structure 122 is in a range of about 10 nm to about 70 nm. The ratio of the width W2 of the extending portion 122e the wall structure 122 to the width W1 the main portion 122m of the wall structure 122 is in a range of about 1 to about 5. If the extending portion 122e the wall structure 122 is too wide, the semiconductor device 10a may occupy too much area. If the extending portion 122e the wall structure 122 is too narrow, the wall structure 122 may not provide enough isolation.

With an extending portion 122e protruding out of the nanostructures 106, the wall structure 122 may not be shrunk at the end of the wall structure 122. The extending portion 122e of the wall structure 122 and the main portion 122m of the wall structure 122 may have different widths.

Figure 4:
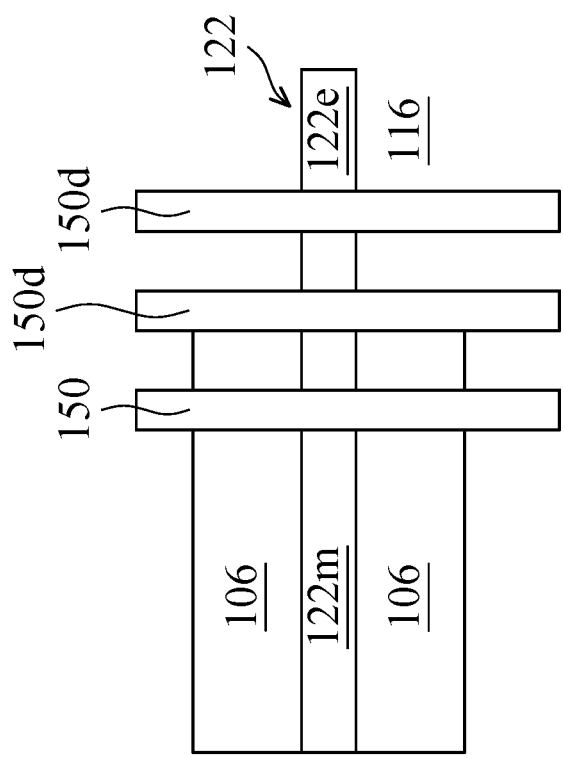
FIG. 4 is a top view of a semiconductor device structure, in accordance with some embodiments of the disclosure.

Many variations and/or modifications may be made to the embodiments of the disclosure. FIG. 4 is a top view of a semiconductor device structure 10d, in accordance with some embodiments of the disclosure. Some processes or devices are the same as, or similar to, those described in the embodiments above, and therefore the descriptions of these processes and devices are not repeated herein. The difference from the embodiments described above is that, floating gate structures 150d are formed over the extending portion 122e of the wall structure 112 over the isolation structure 116.

In some embodiments, a floating gate structure 150d is formed over the boundary between the main portion 122m and the extending portion 122e of the wall structure 122. In some embodiments, the floating gate structure 150d is formed across edges of the nanostructures 106. The floating gate structure 150d may be electrically floating. The floating gate structure 150d and the gate structure 150 may be the same multi-layered structure. The floating gate structures 150d may be also formed over the extending portion 122e of the wall structure 122 over the isolation structure 116. With higher wall structure 122 compared to the isolation structure 116, the floating gate structures 150d may not be collapsed over the isolation structure 116.

One of the floating gate structures 150d may be formed over the boundary of the main portion 122m and the extending portion 122e of the wall structure 122. The extending portion 122e of the wall structure 112 formed over the isolation structure 116 may lower the height of the floating gate structures 150d. Therefore, the floating gate structure 150d may not be collapsed. It should be noted that, the number of the floating gate structures 150d is merely an example, and is not limited therein.

With an extending portion 122e protruding out of the nanostructures 106, the wall structure 122 may not be shrunk at the end of the wall structure 122. The extending portion 122e of the wall structure 122 may also prevent floating gate structures 150d from being collapsed. The number of the floating gate structure 150d forming over the extending portion 122e of the wall structure 112 may be not limited, depending on the design demands.

Figure 5:
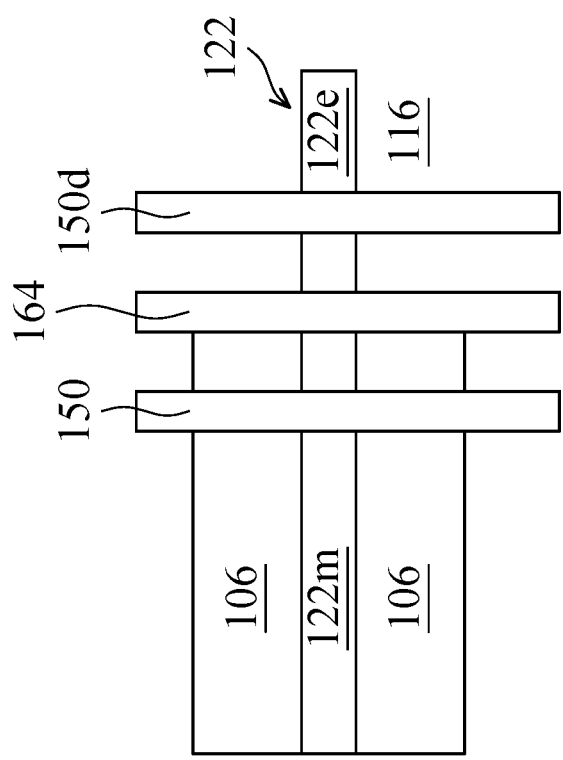
FIG. 5 is a top view of a semiconductor device structure, in accordance with some embodiments of the disclosure.

Many variations and/or modifications may be made to the embodiments of the disclosure. FIG. 5 is a top view of a semiconductor device structure 10e, in accordance with some embodiments of the disclosure. Some processes or devices are the same as, or similar to, those described in the embodiments above, and therefore the descriptions of these processes and devices are not repeated herein. The difference from the embodiments described above is that, a dielectric floating gate structure 164 is formed over the boundary between the main portion 122m of the wall structure 122 and the extending portion 122e of the wall structure 112.

After the gate structures 150 and the floating gate structures 150d are formed, the floating gate structure 150d formed over the edge of the nanostructures 106 is removed. The nanostructures 106 under the floating gate structure 150d may also be removed. Afterwards, the dielectric floating gate structure 164 may be formed at the edge of the nanostructures 106. The dielectric floating gate structure 164 may be physically floating since the dielectric floating gate structure 164 may be made of dielectric materials such as silicon nitride. The extending portion 122e of the wall structure 112 formed over the isolation structure 116 may lower the height of the dielectric floating gate structure 164. Therefore, the dielectric floating gate structure 164 may not be collapsed.

With an extending portion 122e protruding out of the nanostructures 106, the wall structure 122 may not be shrunk at the end of the wall structure 122. The extending portion 122e of the wall structure 122 may also prevent floating gate structures 150d and the dielectric floating gate structure 164 formed over the boundary between the main portion 122m and the extending portion 122e of the wall structure 122 from being collapsed.

Figure 6:
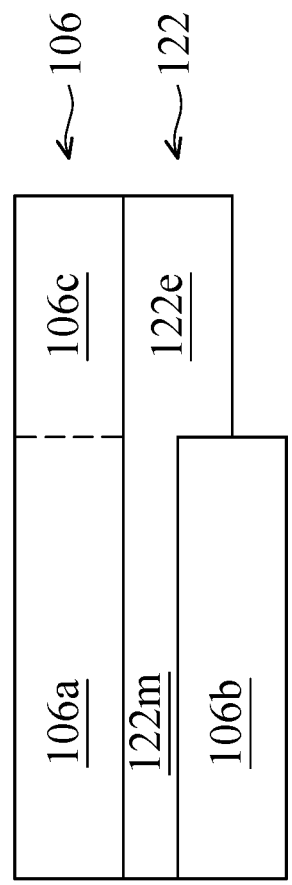
FIG. 6 is a top view of a semiconductor device structure, in accordance with some embodiments of the disclosure.

Many variations and/or modifications may be made to the embodiments of the disclosure. FIG. 6 is a top view of a semiconductor device structure 10f, in accordance with some embodiments of the disclosure. Some processes or devices are the same as, or similar to, those described in the embodiments above, and therefore the descriptions of these processes and devices are not repeated herein. The difference from the embodiments described above is that, the extending portion 122e of the wall structure 122 protruding from the nanostructures 106b is in contact with the sidewall of the nanostructures 106c.

In some embodiments, the nanostructures 106 include nanostructures 106a, 106b, and 106c. The boundary between nanostructures 106a and 106c may be invisible and is shown as a dashed line. Different nanostructures 106a, 106b, and 106c may be channel regions of different transistors. In some embodiments, the nanostructures 106a and 106c may be transistors with the same conductivity type.

In some embodiments, the sidewall of the nanostructures 106 including the nanostructures 106a and 106c is aligned with the sidewall of the extending portion 122e of the wall structure 122. In some embodiments, the extending portion 122e of the wall structure 122 covers a portion of the sidewalls of the nanostructures 106b.

With an extending portion 122e protruding out of the nanostructures 106, the wall structure 122 may not be shrunk at the end of the wall structure 122. The extending portion 122e of the wall structure 122 may also prevent floating gate structures 150d from being collapsed. The extending portion 122e may be in direct contact with nanostructures 106c and protruding from the nanostructures 106b.

Figure 7:
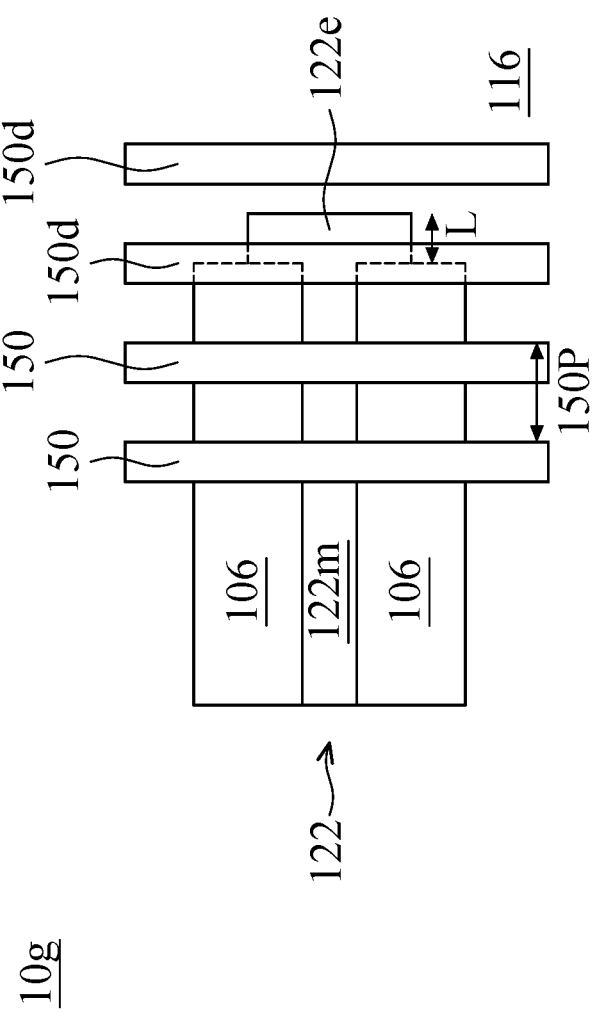
FIG. 7 is a top view of a semiconductor device structure, in accordance with some embodiments of the disclosure.

Many variations and/or modifications may be made to the embodiments of the disclosure. FIG. 7 is a top view of a semiconductor device structure 10g, in accordance with some embodiments of the disclosure. Some processes or devices are the same as, or similar to, those described in the embodiments above, and therefore the descriptions of these processes and devices are not repeated herein. The difference from the embodiments described above is that, the length L of the extending portion 122e of the wall structure 122 is less than the pitch 150P of the gate structures 150.

In some embodiments, a floating gate structure 150d formed over the isolation structure 116 is separated from the extending portion 122e of the wall structure 122. In some embodiments, the ratio of the length L of the extending portion 122e and the pitch 150P of the gate structures 150 is greater than 0.3. If the length L of the extending portion 122e is too less, the wall structure 122 may be shrunk at the edge of the nanostructures 106.

With an extending portion 122e protruding out of the nanostructures 106, the wall structure 122 may not be shrunk at the end of the wall structure 122. The extending portion 122e of the wall structure 122 may also prevent floating gate structures 150d from being collapsed. The length L of the extending portion 122e of the wall structure 122 may be less than the pitch 150P of the gate structures 150.

Figure 8:
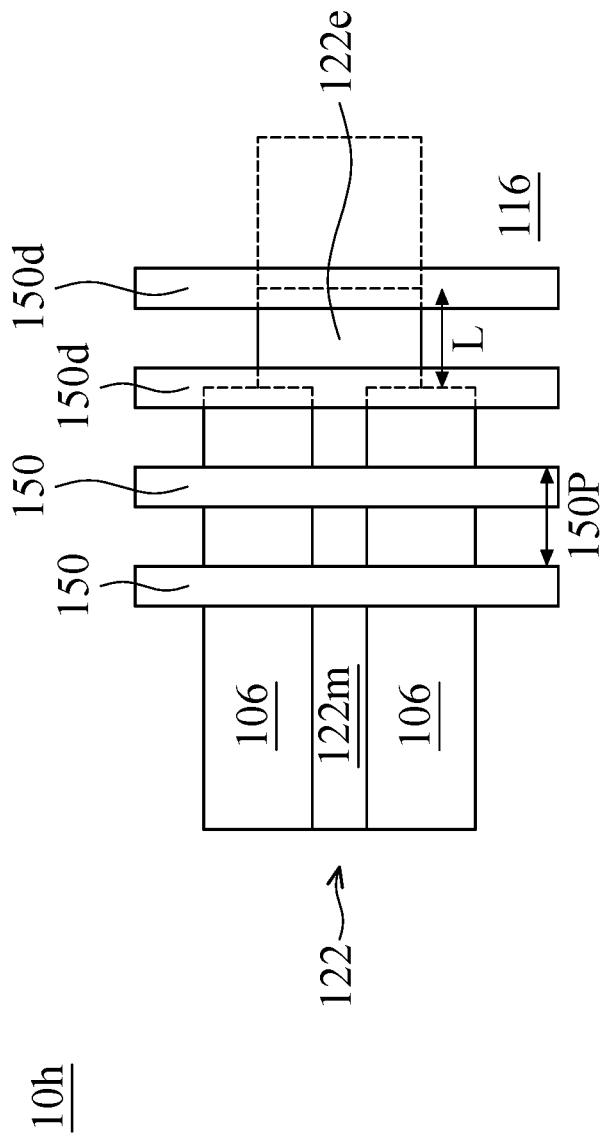
FIG. 8 is a top view of a semiconductor device structure, in accordance with some embodiments of the disclosure.

Many variations and/or modifications may be made to the embodiments of the disclosure. FIG. 8 is a top view of a semiconductor device structure 10h, in accordance with some embodiments of the disclosure. Some processes or devices are the same as, or similar to, those described in the embodiments above, and therefore the descriptions of these processes and devices are not repeated herein. The difference from the embodiments described above is that, the length L of the extending portion 122e of the wall structure 122 is greater than or substantially equal to the pitch 150P of the gate structures 150.

In some embodiments, the length L of the extending portion 122e of the wall structure 122 is substantially equal to the pitch 150P of the gate structures 150. The sidewall of the extending portion 122e may be under the floating gate structure 150d. The length L of the extending portion 122e of the wall structure 122 may be greater than the pitch 150P of the gate structures 150. The extending portion 122e of the wall structure 122 may protrude from the sidewalls of the floating gate structure 150d formed over the isolation structures 116.

With an extending portion 122e protruding out of the nanostructures 106, the wall structure 122 may not be shrunk at the end of the wall structure 122. The extending portion 122e of the wall structure 122 may also prevent floating gate structures 150d from being collapsed. The length L of the extending portion 122e of the wall structure 122 may be greater than or substantially equal to the pitch 150P of the gate structures 150.

Figure 9:
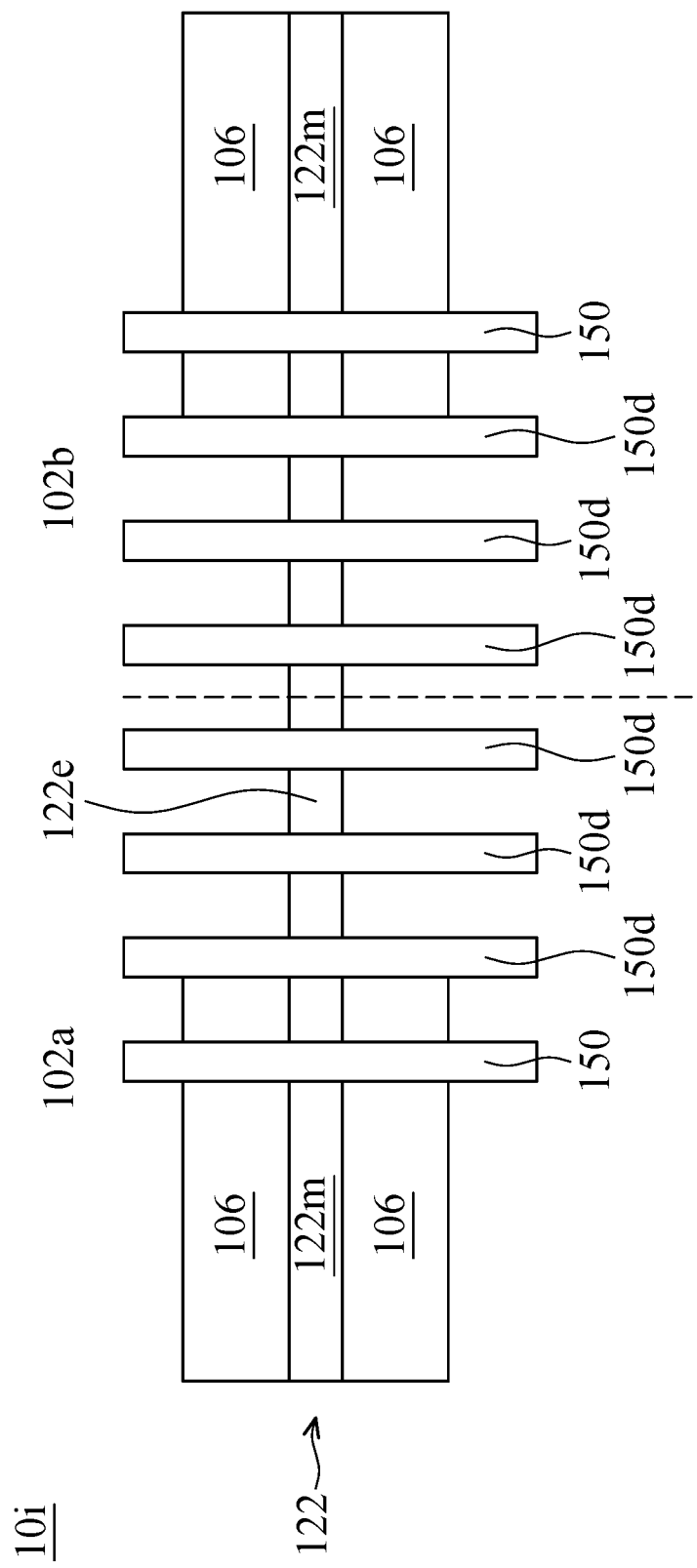
FIG. 9 is a top view of a semiconductor device structure, in accordance with some embodiments of the disclosure.

Many variations and/or modifications may be made to the embodiments of the disclosure. FIG. 9 is a top view of a semiconductor device structure 10i, in accordance with some embodiments of the disclosure. Some processes or devices are the same as, or similar to, those described in the embodiments above, and therefore the descriptions of these processes and devices are not repeated herein. The difference from the embodiments described above is that, the wall structure 122 extends between nanostructures 106 in adjacent region 102a and 102b.

The substrate 102 may include regions 102a and 102b. Different cell arrays may be formed in different regions 102a and 102b. In some embodiments, the wall structure 122 extends between nanostructures 106 in different regions 102a and 102b. In addition, floating gate structures 150d are formed across the extending portion 122e of the wall structure 122 in both regions 102a and 102b. The extending portion 122e of the wall structure 122 may lower the height of the floating gate structures 150d formed over the extending portion 122e in both regions 102a and 102b. Therefore, the floating gate structures 150d may not be collapsed.

It should be noted that, the number of the floating gate structures 150d and the regions 102a and 102b of the substrate 102 shown in FIG. 9 is merely an example, and is not limited therein.

With an extending portion 122e protruding out of the nanostructures 106, the wall structure 122 may not be shrunk at the end of the wall structure 122. The extending portion 122e of the wall structure 122 may also prevent floating gate structures 150d from being collapsed. The wall structure 122 may be extended to regions 102a and 102b of the substrate 102. The extending portion 122e of the wall structure 122 between the adjacent regions 102a and 102b may help to prevent floating gate structures 150d from being collapsed.

Figure 10:
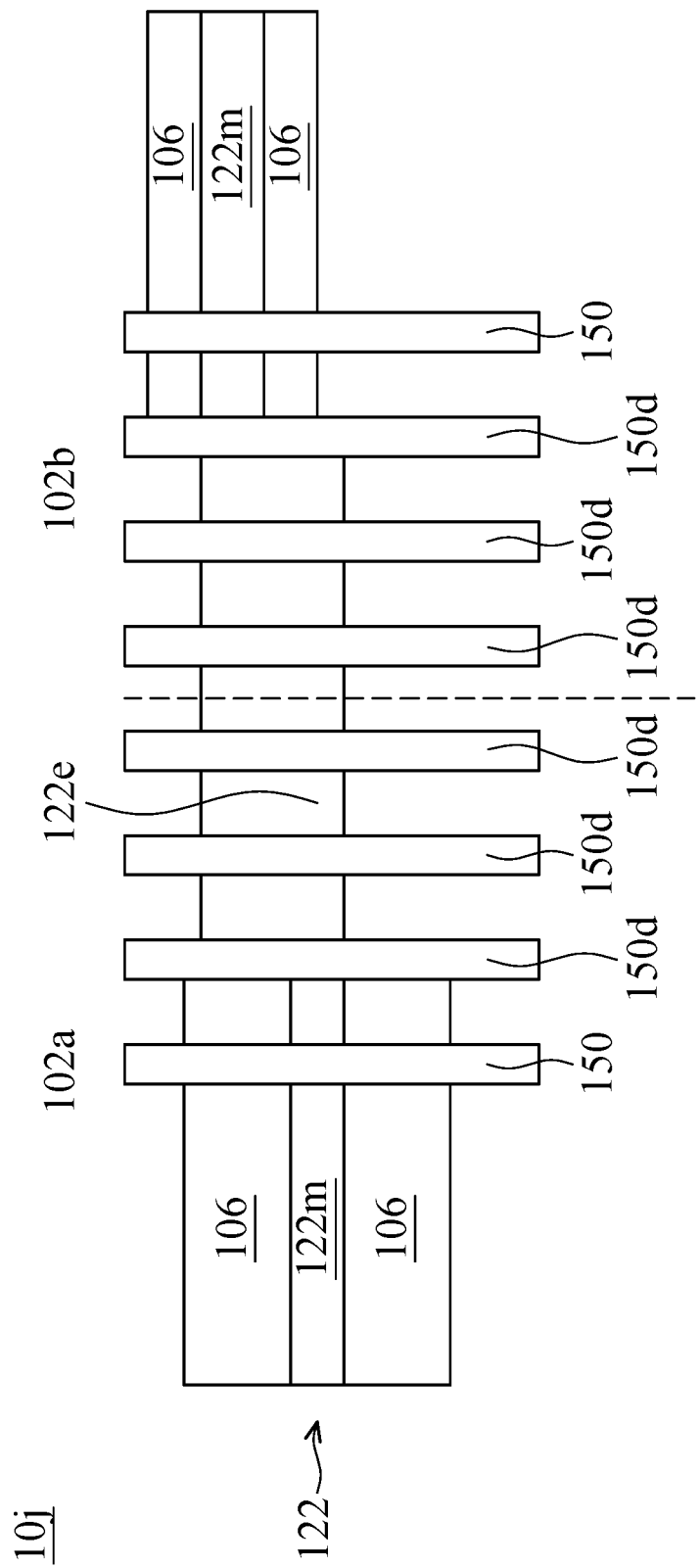
FIG. 10 is a top view of a semiconductor device structure, in accordance with some embodiments of the disclosure.

Many variations and/or modifications may be made to the embodiments of the disclosure. FIG. 10 is a top view of a semiconductor device structure 10j, in accordance with some embodiments of the disclosure. Some processes or devices are the same as, or similar to, those described in the embodiments above, and therefore the descriptions of these processes and devices are not repeated herein. The difference from the embodiments described above is that, the nanostructures 106 in the region 102a may be misaligned with the nanostructures 106 in the region 102b.

In some embodiments, the wall structure 122 extends between nanostructures 106 in different regions 102a and 102b. A sidewall of the extending portion 122e of the wall structure 122 may be aligned with a sidewall of the main portion 122m of the wall structure 122 in each of the region 102a or 102b. In some embodiments, the extending portion 122e is wider than the main portion 122m in each of the region 102a or 102b.

With an extending portion 122e protruding out of the nanostructures 106, the wall structure 122 may not be shrunk at the end of the wall structure 122. The extending portion 122e of the wall structure 122 may also prevent floating gate structures 150d from being collapsed. The wall structure 122 may be extended to regions 102a and 102b of the substrate 102. The extending portion 122e of the wall structure 122 between the adjacent regions 102a and 102b may help to prevent floating gate structures 150d from being collapsed. The nanostructures 106 in different regions 102a or 102b may be not aligned with each other.

Figure 11:
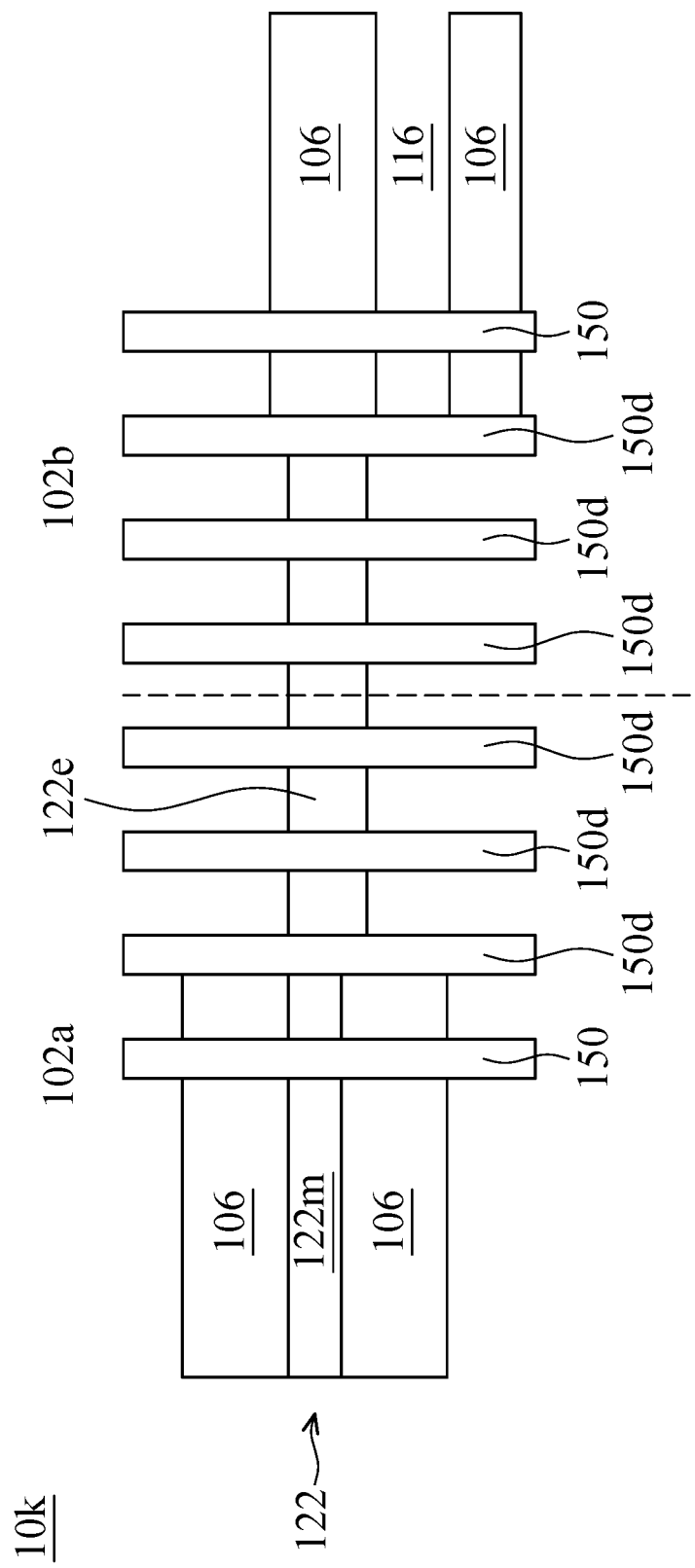
FIG. 11 is a top view of a semiconductor device structure, in accordance with some embodiments of the disclosure.

Many variations and/or modifications may be made to the embodiments of the disclosure. FIG. 11 is a top view of a semiconductor device structure 10k, in accordance with some embodiments of the disclosure. Some processes or devices are the same as, or similar to, those described in the embodiments above, and therefore the descriptions of these processes and devices are not repeated herein. The difference from the embodiments described above is that, the extending portion 122e of the wall structure 122 is in contact with a sidewall of the nanostructures 106 parallel to the gate structure 150 in the region 102b.

In some embodiments, the wall structure 122 is formed between nanostructures 106 in the region 102a, but abutting the sidewalls of the nanostructures 106 in the region 102b. At least one of the sidewalls of the main portion 122m of the wall structure 122 and at least one of the sidewalls of the extending portion 122e of the wall structure 122 may be aligned with each other. The nanostructures 106 in different regions 102a or 102b may be misaligned with each other. The isolation structure 116 may be formed between the nanostructures 106 in the region 102b. The wall structure 122 is not formed between the nanostructures 106 in the region 102b.

With an extending portion 122e protruding out of the nanostructures 106, the wall structure 122 may not be shrunk at the end of the wall structure 122. The extending portion 122e of the wall structure 122 may also prevent floating gate structures 150d from being collapsed. The wall structure 122 may be extended to regions 102a and 102b of the substrate 102. The extending portion 122e of the wall structure 122 between the adjacent regions 102a and 102b may help to prevent floating gate structures 150d from being collapsed. The extending portion 122e of the wall structure 122 may be in direct contact with only one stack of nanostructures 106 in the region 102b.

As described previously, the wall structure 122 with an extending portion 122e protruding from the sidewalls of the nanostructures 106. The wall structure 122 may not be shrunk at the edge of the wall structure 122. The floating gate structures 150d formed over the wall structures 150 may not be collapsed. In some embodiments as shown in FIG. 1D, the pattern of the wall structure 122 is defined by the photoresist layer 118. In some embodiments as shown in FIG. 2F, the wall structure 122 is formed in a self-aligned process. In some embodiments as shown in FIG. 3, the extending portion 122e of the wall structure 122 is wider than the main portion 122m of the wall structure 122. In some embodiments as shown in FIG. 4, a floating gate structure 150d is formed over the boundary between the main portion 122m and the extending portion 122e of the wall structure 122. In some embodiments as shown in FIG. 5, a dielectric floating gate structure 164 is formed over the boundary between the main portion 122m and the extending portion 122e of the wall structure 122. In some embodiments as shown in FIG. 6, the extending portion 122e of the wall structure 122 is in contact with a sidewall of the nanostructures 106. In some embodiments as shown in FIG. 7, the length L of the extending portion 122e of the wall structure 122 is less than the pitch 150P of the gate structures 150. In some embodiments as shown in FIG. 8, the length L of the extending portion 122e of the wall structure 122 is greater than or substantially equal to the pitch 150P of the gate structures 150. In some embodiments as shown in FIG. 9, the wall structure 122 extends between the nanostructures 106 in adjacent regions 102a and 102b. In some embodiments as shown in FIG. 10, the wall structure 122 extends between misaligned nanostructures 106 in adjacent regions 102a and 102b. In some embodiments as shown in FIG. 11, the wall structure 122 in the region 102a extends abutting the nanostructures 106 in adjacent region 102b.

Embodiments of a semiconductor device structure and a method for forming the same are provided. A wall structure extends out of sidewall of the nanostructures in a top view. The wall structure may not be shrunk with the extending portion of the wall structure. In addition, the floating gate structures may be formed over the wall structure to prevent floating gate structures being collapsed.

In some embodiments, a semiconductor device structure is provided. The semiconductor device structure includes first nanostructures formed over a substrate. The semiconductor device structure also includes second nanostructures formed over the substrate. The semiconductor device structure also includes a wall structure formed between the first nanostructures and the second nanostructures. The semiconductor device structure also includes a gate structure formed across the first nanostructures, the second nanostructures, and the wall structure. The wall structure includes a main portion and an extending portion, and the main portion is in direct contact with the first nanostructures and the second nanostructures, and the extending portion protrudes from the sidewalls of the second nanostructures.

In some embodiments, a method for forming a semiconductor device structure is provided. The method for forming a semiconductor device structure includes forming first nanostructures and second nanostructures over a substrate. The method for forming a semiconductor device structure also includes depositing a wall structure material over top surfaces and sidewalls of the first nanostructures and the second nanostructures. The method for forming a semiconductor device structure also includes removing the wall structure material over the first nanostructures and the second nanostructures to form a wall structure between the first nanostructures and the second nanostructures. The method for forming a semiconductor device structure also includes removing end portions of the first nanostructures and the second nanostructures. The wall structure is longer than the first nanostructures and the second nanostructures in a top view.

In some embodiments, a method for forming a semiconductor device structure is provided. The method for forming a semiconductor device structure includes forming nanostructure stacks over a substrate. The method for forming a semiconductor device structure also includes depositing an isolation material surrounding the nanostructure stacks. The method for forming a semiconductor device structure also includes patterning and etching the isolation material between nanostructure stacks. The method for forming a semiconductor device structure also includes forming a wall structure over the isolation material between the nanostructure stacks. The method for forming a semiconductor device structure also includes etching back the isolation material surrounding end portions of the wall structure and the nanostructure stacks.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   first nanostructures formed over a substrate;
   second nanostructures formed over the substrate;
   a wall structure formed between the first nanostructures and the second nanostructures;

a gate structure formed across the first nanostructures, the second nanostructures, and the wall structure, wherein the wall structure comprises a main portion and an extending portion, and the main portion is in direct contact with the first nanostructures and the second nanostructures, and the extending portion protrudes from sidewalls of the second nanostructures; and source/drain epitaxial structures on opposite sides of the gate structure, wherein a bottom surface of the wall structure is lower than bottom surfaces of the source/drain epitaxial structures.

2. The semiconductor device structure as claimed in claim 1, wherein the extending portion of the wall structure is wider than the main portion of the wall structure.

3. The semiconductor device structure as claimed in claim 1, further comprising:

a floating gate structure formed over a boundary of the main portion and the extending portion of the wall structure.

4. The semiconductor device structure as claimed in claim 1, further comprising:

third nanostructures formed over the substrate separated from the first nanostructures;

fourth nanostructures formed over the substrate, floating gate structures formed between the first nanostructures and the third nanostructures;

wherein the wall structure extends toward the third nanostructures, and the floating gate structures are formed across the wall structure.

5. The semiconductor device structure as claimed in claim 4, wherein the wall structure extends between the third nanostructures and the fourth nanostructures.

6. The semiconductor device structure as claimed in claim 4, wherein the wall structure is in contact with a sidewall of the third nanostructures parallel to the floating gate structures.

7. The semiconductor device structure as claimed in claim 1, further comprising:

an isolation material between the first nanostructures and the second nanostructures and below the wall structure, wherein an interface between the isolation material and the wall structure is lower than the bottom surfaces of the source/drain epitaxial structures.

8. The semiconductor device structure as claimed in claim 7, wherein the interface between the isolation material and the wall structure is lower than a top surface of the substrate.

9. The semiconductor device structure as claimed in claim 1, wherein a bottom surface of the wall structure is lower than a top surface of the substrate.

10. A method for forming a semiconductor device structure, comprising:

forming first nanostructures and second nanostructures over a substrate;

depositing a wall structure material over top surfaces and sidewalls of the first nanostructures and the second nanostructures;

removing the wall structure material over the first nanostructures and the second nanostructures to form a wall structure between the first nanostructures and the second nanostructures; and removing end portions of the first nanostructures and the second nanostructures, wherein the wall structure is longer than the first nanostructures and the second nanostructures in a top view;

forming openings when removing the end portions of the first nanostructures and the second nanostructures; and filling the openings with a dielectric material.

11. The method for forming the semiconductor device structure as claimed in claim 10, further comprising:

forming an isolation material between the first nanostructures and the second nanostructures;

etching back the isolation material before forming the wall structure material; and patterning the isolation material before forming the wall structure.

12. The method for forming the semiconductor device structure as claimed in claim 11, further comprising:

forming floating gate structures over the wall structure over the isolation material.

13. The method for forming the semiconductor device structure as claimed in claim 10, further comprising:

forming a floating gate structure across edges of the first nanostructures and the second nanostructures.

14. The method for forming the semiconductor device structure as claimed in claim 10, further comprising:

forming a seam in the wall structure.

15. A method for forming a semiconductor device structure, comprising:

forming nanostructure stacks over a substrate;

depositing an isolation material surrounding the nanostructure stacks;

patterning and etching the isolation material between nanostructure stacks;

forming a wall structure over the isolation material between the nanostructure stacks; and etching back the isolation material surrounding end portions of the wall structure and the nanostructure stacks.

16. The method for forming the semiconductor device structure as claimed in claim 15, further comprising:

patterning and etching end portions of the nanostructure stacks.

17. The method for forming the semiconductor device structure as claimed in claim 15, wherein the wall structure extends in the isolation material surrounding the nanostructure stacks.

18. The method for forming the semiconductor device structure as claimed in claim 15, further comprising:

forming a hard mask layer over the nanostructure stacks; and removing the hard mask layer after forming the wall structure, wherein the wall structure is higher than the nanostructure stacks.

19. The method for forming the semiconductor device structure as claimed in claim 15, further comprising:

forming gate structures over the nanostructure stacks, wherein a distance that the wall structure extends into the isolation material is longer than or substantially equal to a distance between the gate structures.

20. The method for forming the semiconductor device structure as claimed in claim 15, further comprising:

forming a floating gate structure over the isolation material, wherein the floating gate structure is separated from the wall structure.

* * * * *